United States Patent
Bryan et al.

(10) Patent No.: US 9,939,579 B2
(45) Date of Patent: Apr. 10, 2018

(54) MULTILAYERED OPTICAL STRUCTURES

(75) Inventors: Michael A. Bryan, Oakland, CA (US); Xiangxin Bi, San Ramon, CA (US)

(73) Assignee: NeoPhotonics Corporation, San Jose, CA (US)

( * ) Notice: Subject to any disclaimer, the term of this patent is extended or adjusted under 35 U.S.C. 154(b) by 1512 days.

(21) Appl. No.: 11/358,238

(22) Filed: Feb. 21, 2006

(65) Prior Publication Data

US 2006/0141142 A1 Jun. 29, 2006

Related U.S. Application Data

(60) Division of application No. 10/420,343, filed on Apr. 22, 2003, now Pat. No. 7,039,264, which is a
(Continued)

(51) Int. Cl.
*C23C 16/48* (2006.01)
*B05D 5/06* (2006.01)
(Continued)

(52) U.S. Cl.
CPC ............ *G02B 6/12002* (2013.01); *B32B 9/04* (2013.01); *C03B 19/1415* (2013.01);
(Continued)

(58) Field of Classification Search
CPC ........... G02B 6/12002; G02B 6/02042; G02B 6/132; G02B 6/13; C23C 16/483;
(Continued)

(56) References Cited

U.S. PATENT DOCUMENTS 3,785,717 A 1/1974 Croset et al.
3,806,223 A * 4/1974 Keck ...................... C03B 19/14
385/129
(Continued)

FOREIGN PATENT DOCUMENTS

CN 1032080 A 3/1989
CN 1196828 A 10/1998
(Continued)

OTHER PUBLICATIONS

Serway, Raymond A; Beichner, Robert J; Physics for Scientists and Engineers; 2000; Saunders College Publishing; 5th ed; p. A.22.*
(Continued)

*Primary Examiner* — Michael Wieczorek
*Assistant Examiner* — Michael G Miller
(74) *Attorney, Agent, or Firm* — Christensen, Fonder, Dardi & Herbert PLLC; Peter S. Dardi

(57) ABSTRACT

Monolithic optical structures include a plurality of layer with each layer having an isolated optical pathway confined within a portion of the layer. The monolithic optical structure can be used as an optical fiber preform. Alternatively or additionally, the monolithic optical structure can include integrated optical circuits within one or more layers of the structure. Monolithic optical structures can be formed by performing multiple passes of a substrate through a flowing particle stream. The deposited particles form an optical material following consolidation. Flexible optical fibers include a plurality of independent light channels extending along the length of the optical fiber. The fibers can be pulled from an appropriate preform.

24 Claims, 11 Drawing Sheets

Related U.S. Application Data continuation of application No. PCT/US01/45762, filed on Oct. 26, 2001.

(60) Provisional application No. 60/243,491, filed on Oct. 26, 2000.

(51) Int. Cl.

| | | |
|---|---|---|
| *G02B 6/02* | (2006.01) | |
| *G02B 6/12* | (2006.01) | |
| *B32B 9/04* | (2006.01) | |
| *C03B 19/14* | (2006.01) | |
| *C03B 37/014* | (2006.01) | |
| *C03B 37/027* | (2006.01) | |
| *C04B 35/14* | (2006.01) | |
| *C23C 26/00* | (2006.01) | |
| *G02B 6/13* | (2006.01) | |
| *G02B 6/132* | (2006.01) | |

(52) U.S. Cl.
CPC ...... *C03B 19/1423* (2013.01); *C03B 19/1484* (2013.01); *C03B 37/0142* (2013.01); *C03B 37/01413* (2013.01); *C03B 37/01486* (2013.01); *C03B 37/027* (2013.01); *C04B 35/14* (2013.01); *C23C 16/483* (2013.01); *C23C 26/00* (2013.01); *G02B 6/02042* (2013.01); *G02B 6/13* (2013.01); *G02B 6/132* (2013.01); *C03B 2203/34* (2013.01); *C03B 2205/40* (2013.01); *C03B 2207/02* (2013.01); *C03B 2207/34* (2013.01); *C03B 2207/66* (2013.01); *C03B 2207/85* (2013.01); *C04B 2235/3201* (2013.01); *C04B 2235/3203* (2013.01); *C04B 2235/3215* (2013.01); *C04B 2235/3217* (2013.01); *C04B 2235/3224* (2013.01); *C04B 2235/3225* (2013.01); *C04B 2235/3227* (2013.01); *C04B 2235/3232* (2013.01); *C04B 2235/3234* (2013.01); *C04B 2235/3244* (2013.01); *C04B 2235/3251* (2013.01); *C04B 2235/3258* (2013.01); *C04B 2235/3287* (2013.01); *C04B 2235/3293* (2013.01); *C04B 2235/3294* (2013.01); *C04B 2235/3296* (2013.01); *C04B 2235/3298* (2013.01); *C04B 2235/3409* (2013.01); *C04B 2235/3418* (2013.01); *C04B 2235/3463* (2013.01); *G02B 2006/1215* (2013.01); *G02B 2006/12147* (2013.01); *G02B 2006/12176* (2013.01); *Y02P 40/57* (2015.11)

(58) Field of Classification Search
CPC ... C23C 26/00; C03B 37/027; C03B 19/1423; C03B 37/01486; C03B 19/1484; C03B 19/1415; C03B 37/01413; C03B 37/0142; B32B 9/04; C04B 35/14
USPC .................. 427/160–169, 582–585
See application file for complete search history.

(56) References Cited

U.S. PATENT DOCUMENTS

| | | | |
|---|---|---|---|
| 3,806,570 A | 4/1974 | Flamenbaum et al. | |
| 3,826,560 A * | 7/1974 | Schultz ..................... 385/124 | |
| 3,873,339 A * | 3/1975 | Hudson .................. C03B 19/14 | |
| | | | 385/124 |
| 3,883,336 A | 5/1975 | Randall | |
| 3,923,484 A | 12/1975 | Randall | |
| 3,932,162 A | 1/1976 | Blankenship | |
| 3,934,061 A | 1/1976 | Keck et al. | |
| 4,038,370 A | 7/1977 | Tokimoto et al. | |
| 4,113,844 A | 9/1978 | Tokimoto et al. | |
| 4,358,181 A * | 11/1982 | Gulati ............... C03B 37/01413 |
| | | | 385/124 |
| 4,494,968 A * | 1/1985 | Bhagavatula et al. .......... 65/386 | |
| 4,549,891 A * | 10/1985 | Plummer .......... C03B 37/01205 |
| | | | 427/167 |
| 4,619,680 A | 10/1986 | Nourshargh et al. | |
| 4,735,677 A | 4/1988 | Kawachi et al. | |
| 4,791,648 A | 12/1988 | Vojak et al. | |
| 4,814,289 A | 3/1989 | Baeuerle | |
| 4,868,005 A | 9/1989 | Ehrlich et al. | |
| 4,878,728 A | 11/1989 | Mannschke | |
| 4,881,791 A | 11/1989 | Mallinson et al. | |
| 4,925,269 A | 5/1990 | Scrivener | |
| 4,933,262 A | 6/1990 | Beguin | |
| 4,957,775 A | 9/1990 | Black et al. | |
| 5,060,595 A | 10/1991 | Ziv et al. | |
| 5,065,338 A | 11/1991 | Phillips et al. | |
| 5,108,952 A | 4/1992 | Matsuhashi | |
| 5,119,460 A | 6/1992 | Bruce et al. | |
| 5,141,549 A | 8/1992 | Tumminelli | |
| 5,195,161 A | 3/1993 | Adar et al. | |
| 5,200,029 A | 4/1993 | Bruce et al. | |
| 5,205,870 A * | 4/1993 | Sato et al. ..................... 118/722 |
| 5,276,012 A | 1/1994 | Ushida et al. | |
| 5,296,072 A | 3/1994 | Dannoux et al. | |
| 5,317,576 A | 5/1994 | Leonberger et al. | |
| 5,318,614 A | 6/1994 | Beguin | |
| 5,385,594 A | 1/1995 | Kanamori et al. | |
| 5,396,507 A | 3/1995 | Kaminow et al. | |
| 5,447,585 A | 9/1995 | Dannoux et al. | |
| 5,448,586 A | 9/1995 | Shmulovich et al. | |
| 5,551,966 A | 9/1996 | Hirose et al. | |
| 5,556,442 A | 9/1996 | Kanamori et al. | |
| 5,613,995 A * | 3/1997 | Bhandarkar et al. ........... 65/384 |
| 5,622,750 A | 4/1997 | Kilian et al. | |
| 5,666,372 A | 9/1997 | Ball et al. | |
| 5,672,210 A | 9/1997 | Moto et al. | |
| 5,727,096 A | 3/1998 | Ghirardi et al. | |
| 5,729,642 A | 3/1998 | Thaniyavarn | |
| 5,736,429 A | 4/1998 | Tregoat et al. | |
| 5,757,989 A | 5/1998 | Yoshimura et al. | |
| 5,790,730 A | 8/1998 | Kravitz et al. | |
| 5,805,751 A | 9/1998 | Kewitsch et al. | |
| 5,820,942 A | 10/1998 | Singh et al. | |
| 5,863,604 A | 1/1999 | Hunt et al. | |
| 5,870,417 A | 2/1999 | Verdiell et al. | |
| 5,874,134 A | 2/1999 | Rao et al. | |
| 5,885,904 A | 3/1999 | Mehta et al. | |
| 5,930,439 A | 7/1999 | Ojha et al. | |
| 5,958,348 A * | 9/1999 | Bi et al. ................... 422/186.04 |
| 5,966,478 A | 10/1999 | Marcuse et al. | |
| 5,980,637 A | 11/1999 | Singh et al. | |
| 5,997,956 A | 12/1999 | Hunt et al. | |
| 6,011,981 A | 1/2000 | Alvarez et al. | |
| 6,032,871 A | 3/2000 | Borner et al. | |
| 6,074,888 A | 6/2000 | Tran et al. | |
| 6,097,144 A | 8/2000 | Lehman | |
| 6,137,933 A | 10/2000 | Hunter et al. | |
| 6,160,830 A | 12/2000 | Kiely et al. | |
| 6,177,290 B1 | 1/2001 | Jang et al. | |
| 6,193,936 B1 | 2/2001 | Gardner et al. | |
| 6,200,737 B1 | 3/2001 | Walt et al. | |
| 6,215,585 B1 | 4/2001 | Yoshimura et al. | |
| 6,227,722 B1 | 5/2001 | Kropp | |
| 6,239,453 B1 | 5/2001 | Yamada | |
| 6,254,928 B1 | 7/2001 | Doan | |
| 6,256,442 B1 | 7/2001 | Nolan et al. | |
| 6,280,802 B1 | 8/2001 | Akedo et al. | |
| 6,289,032 B1 | 9/2001 | Fay et al. | |
| 6,293,688 B1 | 9/2001 | Deacon | |
| 6,307,995 B1 | 10/2001 | Veligdan | |
| 6,522,820 B2 | 2/2003 | Wang | |
| 6,636,676 B1 * | 10/2003 | Renn ............................. 385/125 |
| 6,690,845 B1 | 2/2004 | Yoshimura et al. | |
| 6,768,856 B2 | 7/2004 | Akwani et al. | |
| 6,790,502 B1 | 9/2004 | Yamamoto et al. | |
| 7,108,894 B2 * | 9/2006 | Renn ............................. 427/596 |
| 2002/0073743 A1 * | 6/2002 | Nakamura et al. ............. 65/484 |

(56) References Cited

U.S. PATENT DOCUMENTS

| | | |
|---|---|---|
| 2003/0035642 A1 | 2/2003 | Bryan |
| 2003/0118841 A1 | 6/2003 | Horne et al. |
| 2006/0134347 A1* | 6/2006 | Chiruvolu .............. C23C 8/00 427/585 |

FOREIGN PATENT DOCUMENTS

| | | | |
|---|---|---|---|
| DE | 199 35 053 | 1/2000 | |
| DE | 19935053 | 1/2000 | |
| EP | 0146196 A2 | 6/1985 | |
| EP | 504882 A2 * | 9/1992 | ............ G02B 6/12 |
| FR | 2152464 | 4/1973 | |
| JP | 63-053273 A | 3/1988 | |
| JP | 63053273 A | 7/1988 | |
| JP | 06324640 | 11/1994 | |
| JP | 08227021 | 5/1995 | |
| JP | 09-359910 | * 12/1997 | ........... C03B 37/018 |
| JP | 2000212766 | 8/2000 | |
| JP | 20001247979 | 9/2001 | |
| WO | 93/16403 A1 | 8/1993 | |
| WO | WO 9827018 A1 * | 6/1998 | ........... C03C 17/002 |
| WO | WO 99/23189 | 5/1999 | |
| WO | WO 99/31532 | 6/1999 | |
| WO | WO 99/61244 | 12/1999 | |
| WO | WO 00/24093 | 4/2000 | |
| WO | WO 01/07155 | 2/2001 | |
| WO | WO 01/22542 | 3/2001 | |
| WO | WO 01/77732 | 10/2001 | |
| WO | WO 02/32588 | 4/2002 | |
| WO | WO 02/44765 | 6/2002 | |

OTHER PUBLICATIONS

International Search Report (PCT/US01/45762) dated Aug. 22, 2002.

International Preliminary Report (PCT/US01/45762) dated Apr. 14, 2003.

China Office Action, English translation provided, Sep. 23, 2005, 10 pages total.

Rabii et al., "Recent advances in the fabrication of hollow glass waveguides", SPIE vol. 3262, pp. 103-107, 1998.

Liang et al., "Laser synthesize silicon-based and ferro-based nano powders", SPIE vol. 3862, pp. 17-21, 1999.

Barbarossa et al., "Effect of temperature gradient on sintering kinetics of doped silica waveguides by flame hydrolysis deposition", SPIE vol. 1794 Integrated Optical Circuits II, pp. 191-197, 1992.

Lebedev et al., "Laser distillation-deposition synthesis of silica glasses with variable concentrations of oxygen deficient centers", SPIE vol. 2498, pp. 65-71, 1995.

Barbarossa et al., "High-silica cascaded three-waveguide couplers for wideband filtering by Flam Hydrolysis on Si", SPIE vol. 1583 Integrated Optical Circuits, pp. 122-128, 1991.

Barbarossa et al., "Optical damage threshold of $P_2O_5$ and $GeO_2$-$P_2O_5$-doped silica waveguides", SPIE vol. 1794 Integrated Optical Circuits II, pp. 185-190, 1992.

Barbarossa et al., "High-silica low-loss three waveguide couplers on Si by Flame Hydrolysis Deposition", SPIE vol. 1513 Glasses for Optoelectronics II, pp. 37-43, 1991.

Maxwell, "Photosensitivity & rare-earth doping in flame hydrolysis deposited planar silica waveguides", SPIE vol. 2695, pp. 16-29, 1996.

Sun et al., "Building passive components with silica waveguides", SPIE vol. 3795, pp. 313-319, 1999.

Center for Nano Particle Control, Website Mansoo CHOI, Associate Professor of Mechanized Engineering, Seoul National University, Jun. 2000.

Saini et al., "Passive Active Resonant Coupler (PARC) Platform with Tapered Passive Waveguide", Proceedings of SPIE, vol. 4087, pp. 254-255, 2000.

Teloptics Corp. Technology Overview, Website Teloptics, 3 pages, 2001.

Donnelly et al., "Selected area growth of GaAs by laser-induced pyrolysis of adsorbed triethylgallim", *Appl. Phys. Lett.*, 54(24):2458-2460 (1989).

Ehbrecht et al., "Laser-induced Production and Characterization of Crystalline Silicon Nanoparticles with Narrow Size Distribution", Surface Engineering: Science and Technology I held during the TMS Annual Meeting, Minerals, Metals and Materials, Warrendale 1999, pp. 241-248.

Huisken et al., "Silicon carbide nanoparticles produced by $CO_2$ laser pyrolysis of $SiH_4/C_2H_2$ gas mixtures in a flow reactor", *Journal of Nanoparticle Research*, 1:293-303 (1999).

Kenyon et al., "Measurement of Photocarrier Lifetimes in Silicon Nanoclusters", *Electrochemical Society Proceedings, Eelctrochemical Society*, Pennington, NJ, 98-19:1726 (1999).

Kudo et al., "1.55-μm Wavelength-Selectable Microarray DFB-LD's with Monolithically Integrated MMI Combiner, SOA and EA-Modulator", *IEEE Photechnology Letters*, 12(3):242-244 (2000).

Nomura et al., "$SiO_2$ thin films deposited by reactive ion-beaming sputtering under ultraviolet light irradiation", *J. Appl. Phys.*, 71(3):1469-1474 (1992).

Scholz et al., "Chemical Vapor Deposition of Silicon Carbide Powders Using Pulsed $CO_2$ Lasers", *Advanced Materials*, 5(1):38-40 (1993).

Xiao et al., "Silicon Nitride Synthesis by Laser Pyrolysis of an Aero-Sol-Dispersed Precursor", Mat. Res. Soc. Symp. Proc., 168:299-304.

Yokoyama et al, "Laser induced metal deposition from organometallic solution", Applied Physics Letters, 44(8):755-757 (1984).

Barbarossa et al, "Vertically Integrated High-Silica Channel Waveguides on Si", Electronic Letters, 28(5):437-438 (1992).

European Office Action for patent application No. 01987220.9 dated Aug. 13, 2008.

* cited by examiner

MULTILAYERED OPTICAL STRUCTURES

CROSS REFERENCE TO RELATED APPLICATIONS

This application is a divisional of U.S. patent application Ser. No. 10/420,343 filed on Apr. 22, 2003, now U.S. Pat. No. 7,039,264 to Bryan et al., entitled Multilayered Optical Structures," incorporated herein by reference, which is a continuation of copending PCT Application designating the U.S. Serial Number PCT/US01/45762, filed on Oct. 26, 2001 and now published as WO 02/44765, entitled "Multilayered Optical Structures," incorporated herein by reference, which claims priority to U.S. Provisional Patent Application Ser. No. 60/243,491, filed Oct. 26, 2000, to Bryan et al., entitled "Multilayered Optical Devices," incorporated herein by reference.

FIELD OF THE INVENTION

The invention relates to multiple layer optical structures including layers of optical materials such as glasses and crystalline materials. In particular, the invention relates to structures with multiple optical layers with varying optical properties for use in, for example, planar optical devices, optical fibers, preforms for optical fibers, optical memory and the like.

BACKGROUND OF THE INVENTION

The consolidation or integration of mechanical, electrical and/or optical components into integral devices has created enormous demands on material processing. Furthermore, it is desirable to place greater numbers of integrated devices in the same volumes. To form these integrated structures, there is considerable interest in the application of specific compositions with selected properties onto substrates. In order to form optical devices with high quality optical materials, the coatings or layers of material generally are highly uniform.

Presently used optical communication light wavelengths are from 1.3 to 1.6 microns. Optical waveguides generally have dimensions many times the wavelength. Thus, optical structures can have dimensions from a few microns to about 100 microns depending on optical mode requirements and other factors.

An explosion of communication and information technologies including internet based systems has motivated a world wide effort to implement optical communication networks to take advantage of a large bandwidth available with optical communication. The capacity of optical fiber technology can be expanded further with implementation of Dense Wavelength Division Multiplexing technology. With increasing demands, more channels are needed to fulfill the system functions. The production of increasingly complex optical components requires the deposition of high quality optical materials with increasingly complex structures and/or compositions. Furthermore, the optical materials must be fashioned into specific devices.

Basic characteristics of optical materials include surface quality, uniformity and optical quality. Optical quality refers to small enough absorption and scattering loss to achieve desired levels of transmission. Optical quality also includes the uniformity of optical properties, such as index-of-refraction, and bi-refringence properties. In addition, optical quality is affected by interface quality, such as the interface between the core layers and cladding layers. For silica ($SiO_2$) and several other materials preferred forms for optical transmission are a glass, while for some other materials single crystal forms may have the highest quality optical transmission.

Several approaches have been used and/or suggested for the deposition of the optical materials. These approaches include, for example, flame hydrolysis deposition, chemical vapor deposition, physical vapor deposition, sol-gel chemical deposition and ion implantation. Flame hydrolysis and forms of chemical vapor deposition have been successful in the production of glass fibers for use as fiber optic elements. Flame hydrolysis deposition involves the use of a hydrogen-oxygen flame to react gaseous precursors to form particles of the optical material as a coating on the surface of the substrate. Subsequent heat treatment of the coating can result in the formation of a uniform optical material, which generally is a glass material.

The introduction of different elements, either dopants or stoichiometric components, into desired compositions can be difficult. In particular, blending elements to form complex compositions for optical materials can be challenging. Further challenges can result if particular complex compositions are to be located at particular locations within a structure.

Approaches have been developed for the production of highly uniform submicron and nanoscale particles by laser pyrolysis. Highly uniform particles are desirable for the fabrication of a variety of devices including, for example, batteries, polishing compositions, catalysts, and phosphors for optical displays. Laser pyrolysis involves an intense light beam that drives the chemical reaction of a reactant stream to form highly uniform particles following the rapid quench of the stream after leaving the laser beam. Laser pyrolysis has the advantage that a variety of different elements can be incorporated into the particle compositions.

SUMMARY OF THE INVENTION

In a first aspect, the invention pertains to a monolithic optical structure comprising a plurality of layers. Each layer has an isolated optical pathway confined within a portion of the layer. The monolithic optical structure can include one or more integrated optical circuits. In some embodiments, especially for use as a preform, the monolithic optical structure can include a plurality of isolated optical pathways comprising an optical core extending through at least one linear dimension of the structure.

In a further aspect, the invention pertains to a method for forming a monolithic optical structure, the method comprising performing multiple passes of a structure through a flowing stream of particles. The composition of the particles changes between passes. The particles form multiple layers, each layer having an optical material following consolidation with a plurality of layers each having an isolated pathway confined within a portion of the layer. A particular layer may or may not have uniform optical properties across the layer.

In another aspect, the invention pertains to a flexible optical fiber having a plurality of independent light channels. The light channels comprise a core optical material extending along the length of the optical fiber.

Furthermore, the invention pertains to a method of forming an optical fiber including pulling a patterned/layered preform while heating the preform to a softening temperature to form an optical fiber. The optical fiber has a plurality of independent light channels comprising core optical material.

In addition, the invention pertains to a computer comprising nonvolatile optical memory storing a plurality of programs that are selectively accessible.

Moreover, the invention pertains to a method for forming a structure with at least three particle coatings each covering at least a portion of the substrate surface, the method includes depositing at least a portion of a particle stream onto a substrate. The deposition of particles includes moving the substrate through the particle stream three times within a period of no more than about one minute.

In further embodiments, the invention pertains to an optical fiber preform comprising a plurality of layers of optical material forming a plurality of isolated optical pathways extending through a linear dimension of the structure.

Also, the invention pertains to a method of operating a computer comprising selecting a program from non-volatile optical memory and executing the program. The non-volatile optical memory comprises a plurality of programs.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION OF THE INVENTION

Figure 1:
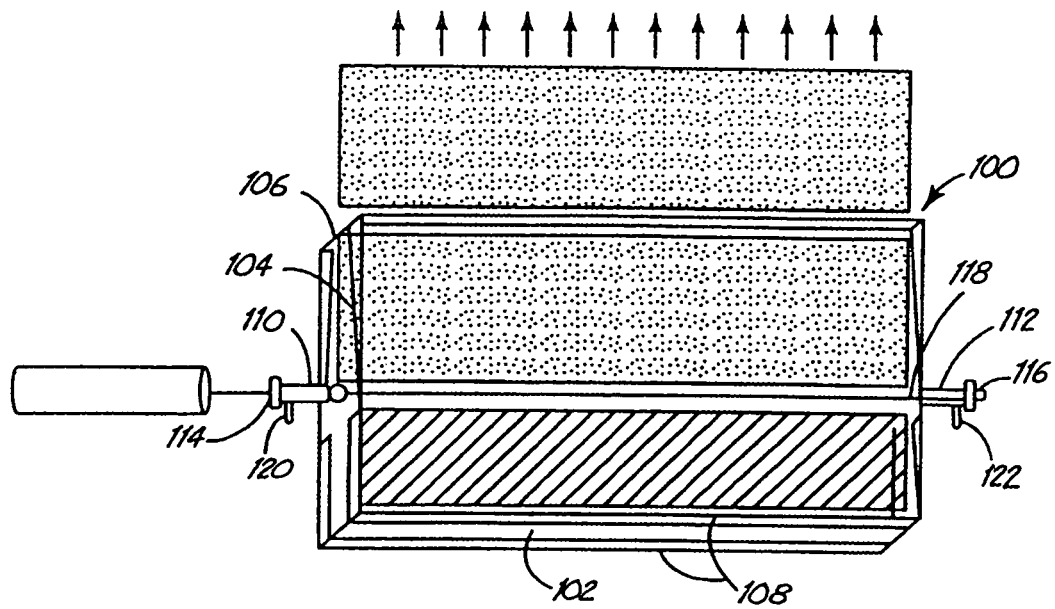
FIG. 1 is a side perspective view of a reaction chamber for performing laser pyrolysis synthesis of powders at high production rates.

Complex optical structures can be created having a plurality of optical pathways within a multilayered optical material having selected optical properties within the layers and/or portions of layers. These complex structures can be used effectively to achieve enhanced optical transmission and processing capabilities. Focused radiation (e.g., light) reactive deposition is a versatile approach for the formation of layered material with, for example, varying index-of-refraction and/or composition to introduce appropriate optical properties to specific layers or portions of layers within the multilayered structure. In embodiments of particular interest, multilayered structures are formed that incorporate desired optical channels/pathways in optically isolated layers and, in some embodiments, at optically isolated channels within a layer. The multilayered structure can be adapted for forming multidimensional optical structures with individual layers, optionally, functioning as an optical circuit with integrated optical devices, or for forming articles such as a multichannel optical fiber from a multilayer preform. The multidimensional optical structure can be used to form a multidimensional optical memory system.

Multilayer optical structures of particular interest have domains in the form of layers or portions of layers that have different optical properties from each other. These varying optical properties can be exploited in the formation of independent optical channels within of the multilayer optical structures. The optical properties of interest for the varying optical materials include, for example, index-of-refraction, dispersion, bi-refringence, optical activity, absorbance/transmission, and the like. Optical properties of a material can be varied, for example, by changing the density, structure, homogeneity, and chemical composition. Chemical composition, in particular, can provide a versatile parameter for the adjustment of optical properties over a significant range. Within a multilayer structure, the selection of optical properties for particular layers or portions of layers generally can be based on the intended use of the structure.

A new process has been developed, termed focused light (e.g., light) reactive deposition, to form highly uniform coatings and devices. Focused radiation (e.g., light) reactive deposition involves a focused radiation (e.g., light) driven flowing reactor configured for the deposition of product particles onto a surface following formation of the particles in a flow. Focused radiation (e.g., light) reactive deposition incorporates features of a radiation-based process for driving the reaction of a flowing reactant stream to form submicron powders, which, when it incorporates an intense light beam as the radiation source, is known as laser pyrolysis, into a direct coating process. In particular, a wide range of reaction precursors can be used for generate a reactant stream with compositions in gas, vapor and/or aerosol form, and a wide range of highly uniform product particles can be efficiently produced. Reactant delivery approaches developed for laser pyrolysis can be adapted for focused radiation (e.g., light) reactive deposition. For convenience, this application refers to radiation-based pyrolysis and laser pyrolysis interchangeably and to focused radiation reactive deposition and light reactive deposition interchangeably.

In laser pyrolysis, the reactant stream is reacted by an intense light beam, such as a laser beam. While a laser beam is a convenient energy source, other intense light sources can be used in laser pyrolysis. Laser pyrolysis provides for formation of phases of materials that are difficult to form under thermodynamic equilibrium conditions. As the reactant stream leaves the light beam, the product particles are rapidly quenched. For the production of doped materials and other complex optical materials, the present approaches have the advantage that the composition of the materials can be adjusted over desirable ranges.

A basic feature of successful application of laser pyrolysis/light reactive deposition for the production of particles and corresponding coatings with desired compositions is production of a reactant stream containing an appropriate precursor composition. In particular, for the formation of doped materials by light reactive deposition, the reactant stream can include host glass or crystal precursors and, optionally, dopant precursors. In particular, the composition of the product optical materials can be adjusted to desired stoichiometries and dopant compositions by varying the composition of the reactant stream. Similarly, unless the precursors are an appropriate radiation absorber, an additional radiation absorber is added to the reactant stream to absorb light energy for transfer to other compounds in the reactant stream. Other additional reactants can be used to adjust the oxidizing/reducing environment in the reactant stream.

Submicron inorganic particles with various stoichiometries and crystal structures, including amorphous structures, have been produced by laser pyrolysis, alone or with additional processing. Specifically, amorphous and crystalline submicron and nanoscale particles can be produced with selected dopants using laser pyrolysis. Similarly, using light driven reaction approaches a variety of new materials can be produced. Light reactive deposition can be used to form highly uniform coatings of glasses, i.e., amorphous materials, and crystalline materials, optionally with dopants including, for example, complex blends of dopant compositions.

To form a uniform glass layer, a layer of amorphous particles deposited by light reactive deposition can be consolidated/densified. To consolidate the glass, the powders are heated to a temperature above their flow temperature. At these temperatures, the powders densify to form a uniform layer of glass material. Substantially uniform optical materials have an optical quality that permits transmission of light. Incorporation of the dopants into the particles results in a distribution of the dopants through the resulting densified glass material directly as a result of the powder deposition. Similarly, crystalline optical materials, such as sapphire, can be formed into layers by the consolidating of crystalline powders, such as aluminum oxide for the formation of sapphire. Dopants can be also introduced into crystalline materials. Similarly, appropriate heating and quenching rates generally can be used to consolidate an amorphous material into a crystalline layer (generally slow quenching rates) and a crystalline powder into a glass layer (generally a rapid quench).

Common commercial approaches for the introduction of dopants, especially rare earth dopants, into glass materials involve initial formation of the glass and subsequent introduction of the dopants into the glass from a vapor or liquid state. The glass can be made porous to facilitate the introduction of dopants into the glass. These approaches generally require multiple steps to produce the porous glass. In addition, it may be difficult to obtain desired dopant concentrations and uniform distribution of the dopants. In contrast, the flowing reaction approaches described herein directly incorporate the dopants directly into the glass materials. Thus, there is no need to make glass porous, and the number of steps is reduced with generally no additional steps needed to alter the composition.

By adapting the properties of laser pyrolysis, light reactive deposition is able to deposit highly uniform, very small particles. Due to the uniformity and small size of the powders, light reactive deposition can be used to form uniform and smooth coating surfaces. Using light reactive deposition, silicon oxide glass coatings following heating have been formed that have a root mean square surface roughness, as measured by atomic force microscopy, of about 0.25 to about 0.5 nm. Thus, the surfaces are smoother than are thought to be obtained by flame hydrolysis deposition and roughly comparable to smoothnesses obtainable by chemical vapor deposition. These smooth glass coating applied by light reactive deposition (LRD) were deposited at relatively high deposition rates by moving the substrate through the product stream. Thus, LRD has already demonstrated the ability to be an efficient and effective approach for the formation of very high quality glass coatings.

Furthermore, using light reactive deposition, it is possible to form complex structures with intricate variation of materials with selectively varying compositions. Furthermore, by adapting laser pyrolysis techniques for the production of commercial quantities of powders, light reactive deposition can form high quality coatings at very rapid rates. Multiple layers can be formed by additional sweeps of the substrate through the product particle stream.

Since each coating layer has high uniformity and smoothness, a large number of layers can be stacked while maintaining appropriate control on the layered structure such that optical devices can be formed throughout the layered structure without structural variation adversely affecting the ability to form optical devices. Composition can be varied between layers, i.e., perpendicular to the plane of the structure, and/or portions of layers, within the pane of the structure, to form desired optical structures. Thus, layered structures of stacked integrated optical devices can be formed.

To form the optical layers, coated substrates generally must be heated to generate a uniform optical materials with acceptable optical properties. Consolidation of the layers into densified optical materials can be performed at various stages in the layer formation. For example, this heating step can be performed after the deposition of each layer, after the deposition of several layers or after the deposition of all the layers. One or more layers for consolidation can be patterned to locate particular optical materials at portions of a layer. By selectively heating a substrate over only a portion of a substrate, only a portion of a layer may be consolidated during a particular heating step. In general, providing more heating steps improves the quality of the glass layers but requires more processing effort. Light reactive deposition can produce higher quality layers that can be heat processed following the deposition of many layers without decreasing excessively the resulting quality of the composite structure.

To form patterned structures within a layer, patterning approaches, such as lithography and photolithography, along with etching, such as chemical etching or radiation-based etching, can be used to form desired patterns in one or more layers. This patterning generally is performed on an intermediate deposition product prior deposition of additional material.

The formation of the multilayered-multipath optical materials described herein generally is based on the deposition of a plurality of layers, each of which may or may not be contoured to form a particular structure within a specific layer. The ability to form multilayered optical structures opens the possibility for forming optical materials with greater transmission capability in a significantly smaller volume. For example, a plurality of optical channels, i.e., pathways, along different layers can be incorporated into a single structure, for example, by varying deposited material in the z-plane, i.e., the plane perpendicular to the coated substrate plane. Alternatively or in addition, a plurality of structures can be formed over a single layer to form adjacent optical channels along a layer by selectively depositing selected optical materials over only a portion of a layer or by appropriately etching or otherwise contouring the materials to form isolated domains within the layer, i.e., within the x-y plane of the substrate. The single monolithic structures with a plurality of optical channels provide for the simultaneous transmission of a corresponding plurality of uncorrelated optical signals with each optical signal having a fill bandwidth according to the material(s) within the specific optical channel. Due to the optical separation of the optical channels within the monolithic structure, the signals can remain uncorrelated even though the spatial separation may be small.

Using multilayered optical structures, planar optical devices can be formed with individual layers involving optical circuits with optical waveguides and, in general, a plurality of additional integrated optical devices, such as couplers, amplifiers and the like. Thus, a stacked structure with a plurality of integrated optical circuits can be formed within a monolithic form. In this way, a large number of optical devices can be situated within a small volume. In some embodiments, with layer-based stacking of integrated optical circuits, a quantitative jump in packing capability is achievable to fit a very large number of integrated optical circuits along a planar surface, generally on a planar substrate. Due to the small thickness of the layers, the presence of additional layers each having integrated optical circuits and/or other optical devices can be added without significantly altering the overall space occupied by the monolithic form. Thus, an order of magnitude or larger increase in optical processing capability can easily be added in the same foot-print as previous devices.

Similarly, the multilayered optical structures can be used as fiber preforms. Optical fibers are generally pulled from a larger block of material. The block of material provides the source of optical material, which has the selected compositions for the fiber in an appropriate arrangement within the preform, although, in alternative embodiments, the composition within the fiber or portions thereof also can be changed with dopants or additional dopants following formation of the fiber. Generally, the composition of the fiber does not need to be changed following fiber formation since light reactive deposition can introduce with great versatility the desired compositions into selected layers and positions within the layer of the preform. This versatility is particularly valuable in forming the multilayered preforms since particular compositions can be located at desired locations within the preform.

Optical fibers include a core surrounded by cladding material wherein the core and cladding have different indices-of-refraction such that light of appropriate frequency is confined to the core region. In particular, using light reactive deposition, a fiber preform can be produced with a selected chemical composition that varies within a layer and between layers, such that a plurality of independent optical channels can be formed in a two dimensional array within a monolithic form. The monolithic form with compositions varying in two dimensions can be used as a preform that is pulled to form a fiber with a corresponding plurality of independent light channels arrayed within a single fiber to provide a corresponding increase in transmission capacity. The organization of the varying compositions within the preform is maintained in the corresponding fiber, although the dimensions of the structures clearly are altered in pulling the fiber. In addition, a multi-layered monolithic structure can be used as a connector for a multi-channel optical fiber and/or for a monolithic optical structure with stacked layers of integrated optical circuits.

The ability to form complex three-dimensional optical structures can be advantageously adapted for the formation of a robust three-dimensional optical memory device, optical waveguide/conduit/fiber (e.g., Bragg grating), optical attenuator, optical splitter/coupler, optical filter, optical switch, laser, modulator, interconnect, optical isolator, optical add-drop multiplexer (OADM), optical amplifier, optical polarizer, optical mirror/reflector, optical phase-retarder, and optical detector. In some embodiments, the three-dimensional optical structure can be formed as an optical fiber preform. In selected embodiments, the optical memory units can be formed as a high volume non-volatile memory system. Units within the monolithic structure form individually addressable data elements for data storage. The non-volatile memory can be advantageously used to store computer programs.

Light Reactive Deposition For Coating Formation

In embodiments of particular interest, the optical layers are formed by light reactive deposition. A highly uniform flow of product particles are formed that are directed toward a substrate to be coated. The resulting particle coating can be formed into an optical material, such as a glass or crystal.

Light reactive deposition is a coating approach that uses an intense light source to drive synthesis of desired compositions from a flowing reactant stream. Light reactive deposition generally results in deposition of powders, although hot particles deposited on the surface can partly fuse during the deposition process due to their temperature. Light reactive deposition has similarities with laser pyrolysis for powder synthesis in that an intense focused radiation (e.g., light) source drives the reaction. Laser pyrolysis involves a flowing reactant stream that intersects with an intense radiation (e.g., light) beam, i.e., focused transmission, at a reaction zone where reaction products form particles. While the particles produced in laser pyrolysis are collected for subsequent use, in light reactive deposition, the resulting compositions are directed to a substrate surface where a coating is formed. The characteristics of laser pyrolysis that lead to the production of highly uniform particles can be correspondingly implemented in the production of coatings with high uniformity.

In light reactive deposition, the coating of the substrate can be performed in a coating chamber separate from the reaction chamber or the coating can be performed within the reaction chamber. In either of these configurations, the reactant delivery system can be configured similarly to a reactant delivery system for a laser pyrolysis apparatus for the production of particles with various compositions. Thus, a wide range of coatings can be formed for further processing into optical materials.

If the coating is performed in a coating chamber separate from the reaction chamber, the reaction chamber is essentially the same as the reaction chamber for performing laser pyrolysis, although the reactant throughput and the reactant stream size may be designed to be appropriate for the coating process. For these embodiments, the coating chamber and a conduit connecting the coating chamber with the reaction chamber replace the collection system of the laser pyrolysis system. If the coating is performed within the reaction chamber, a substrate intercepts flow from the reaction zone to directly deposit particles onto a substrate.

A laser pyrolysis apparatus design incorporating an elongated reactant inlet has been developed that facilitates production of commercial quantities of particles. This design has been described in U.S. Pat. No. 5,958,348 to Bi et al., entitled "Efficient Production of Particles by Chemical Reaction," incorporated herein by reference. Additional embodiments and other appropriate features for commercial capacity laser pyrolysis apparatuses are described in copending and commonly assigned U.S. patent application Ser. No. 09/362,631 now abandoned, which was published as U.S. 2001/0051118 to Mosso et al., entitled "Particle Production Apparatus," incorporated herein by reference. These designs for commercial production of powders by laser pyrolysis can be adapted for rapid coating of high quality optical materials by light reactive deposition.

In some embodiments of a high capacity laser pyrolysis apparatus, the reaction chamber and reactant inlet are elongated significantly along the light beam to provide for an increase in the throughput of reactants and products. By orienting the light beam along the elongated reactant stream, a sheet of product particles is generated. The delivery of gaseous/vapor reactants and/or aerosol reactants, as described further below, can be adapted for the elongated reaction chamber design. The size of the elongated reactant inlet can be selected based on the size of the substrate to be coated.

In general, the particle production apparatus with the elongated reaction chamber and reactant inlet is designed to reduce contamination of the chamber walls, to increase the production capacity and to make efficient use of resources. Due to the chamber design, the elongated reaction chamber can provide for an increased throughput of reactants and products without a corresponding increase in the dead volume of the chamber. The dead volume of the chamber can become contaminated with unreacted compounds and/or reaction products. Furthermore, an appropriate flow of shielding gas can confine the reactants and products within a flow stream through the reaction chamber. The high throughput of reactants makes efficient use of the focused radiation (e.g., light) energy.

With light reactive deposition, the rate of particle production can vary in the range(s) from about 5 grams per hour of reaction product to about 10 kilograms per hour of desired reaction product. Specifically, using apparatuses described herein, coating can be accomplished at particle production rates of up to at least about 10 kilograms per hour (kg/hr), in other embodiments at least about 1 kg/hr, in other embodiments with lower production rates at least about 25 grams per hour (g/hr) and in additional embodiments at least about 5 g/hr. A person of ordinary skill in the art will recognize that production rates intermediate between these explicit production rates are contemplated and are within the present disclosure. Exemplary rates of particle production (in units of grams produced per hour) include not less than about 5, 10, 50, 100, 250, 500, 1000, 2500, 5000, or 10000.

Not all of the particles generated are deposited on the substrate. In general the deposition efficiency depends on the relative speed of the substrate through the product stream with the particles, for embodiments based on moving the substrate through a sheet of product particles. At moderate relative rates of substrate motion, coating efficiencies of about 15 to about 20 percent have been achieved, i.e. about 15 to about 20 percent of the produced particles are deposited on the substrate surface. Routine optimization can increase this deposition efficiency further. At slower relative motion of the substrate through the product particle stream, deposition efficiencies of at least about 40% have been achieved. In some embodiments, the rates of particle production are such that at least about 5 grams per hour, or alternatively or in addition, at least about 25 grams per hour, of reaction product are deposited on the substrate. In general, with the achievable particle production rates and deposition efficiencies, deposition rates can be obtained of at least about 5 g/hr, in other embodiments at least about 25 g/hr, in further embodiments at least from about 100 g/hr to about 5 kg/hr and in still other embodiment from about 250 g/hr to about 2.5 kg/hr. A person of ordinary skill in the art will recognize that deposition rates between these explicit rates are contemplated and are within the present disclosure. Exemplary rates of particle deposition (in units of grams deposited per hour) include not less than about 5, 10, 25, 50, 100, 250, 500, 1000, 2500, or 5000.

Alternatively or in addition, the invention provides that the rate of the movement of the substrate and the particle flow relative to each other can vary substantially, depending on the desired specifications for the coated substrate. Thus, in one embodiment, the rate can be measured on an absolute scale, and can vary in the range(s) from about 0.001 inches per second to about 12 inches per second, or even more. Further, in another embodiment, the rate can be measured on a scale relative to the substrate being coated, and can vary in the range(s) from about 1 substrate per minute to about 1 substrate per second.

For appropriate embodiments using a sheet of product particles, the rate of substrate motion generally is a function of the selected deposition rate and the desired coating thickness as limited by the ability to move the substrate at the desired rate while obtaining desired coating uniformity. Due to the high deposition rates achievable with light reactive deposition, extremely fast coating rates are easily achievable. These coating rates by LRD are dramatically faster than rates that are achievable by competing methods. In particular, at particle production rates of about 10 kg/hr, an eight-inch wafer can be coated with a thickness of about 10 microns of powder in approximately one second even at a deposition efficiency of only about 2.5 percent, assuming a powder density of about 10% of the bulk density. A person of ordinary skill in the art can calculate with simple geometric principles a particular coating rate based on the deposition rate, the desired thickness and the density of powder on the substrate.

Furthermore, the rapid production rate can be advantageously used to form a plurality of particles coatings with or without consolidation between coatings. Each coating can cover an entire layer or a portion of a layer. Compositions can be changed within a layer or between layers. When changing compositions significantly between layers, it may be desirable to wait a few seconds for the product stream to stabilize. In general, reasonably sized substrated described herein can be coated with three particle coatings in less than about 1 minute, in other embodiments less than about 15 seconds, and in other embodiments within range(s) from about 9 seconds to about 3 seconds. Similarly, reasonably sized substrated described herein can be coated with five particle coatings in less than about 1 minute, in other embodiments less than about 25 seconds, and in other embodiments within range(s) from about 15 seconds to about 5 seconds. A person of ordinary skill in the art will recognize that ranges and subranges within these explicit ranges are contemplated and are within the present disclosure.

The design of the improved reaction chamber 100 is shown schematically in FIG. 1. A reactant inlet 102 leads to main chamber 104. Reactant inlet 102 conforms generally to the shape of main chamber 104. Main chamber 104 includes an outlet 106 along the reactant/product stream for removal of particulate products, any unreacted gases and inert gases. Shielding gas inlets 108 are located on both sides of reactant inlet 102. Shielding gas inlets are used to form a blanket of inert gases on the sides of the reactant stream to inhibit contact between the chamber walls and the reactants or products. The dimensions of elongated reaction chamber 104 and reactant inlet 102 can be designed for high efficiency particle production. Reasonable dimensions for reactant inlet 102 for the production of nanoparticles, when used with a $CO_2$ laser with a power in the several kilowatt range, are from about 5 mm to about 1 meter.

Tubular sections 110, 112 extend from the main chamber 104. Tubular sections 110, 112 hold windows 114, 116, respectively, to define a light beam path 118 through the reaction chamber 100. Tubular sections 110, 112 can include inert gas inlets 120, 122 for the introduction of inert gas into tubular sections 110, 112.

Outlet 106 can lead to a conduit directed to a coating chamber. There is not necessarily a change in dimension that demarcates a transition from the reaction chamber to a conduit to the coating chamber. The reaction zone is located within the reaction chamber, and the conduit can but not necessarily involves a change in direction of the flow. Alternatively, a substrate can intercept the product flow to coat the substrate within the reaction chamber.

Figure 2:
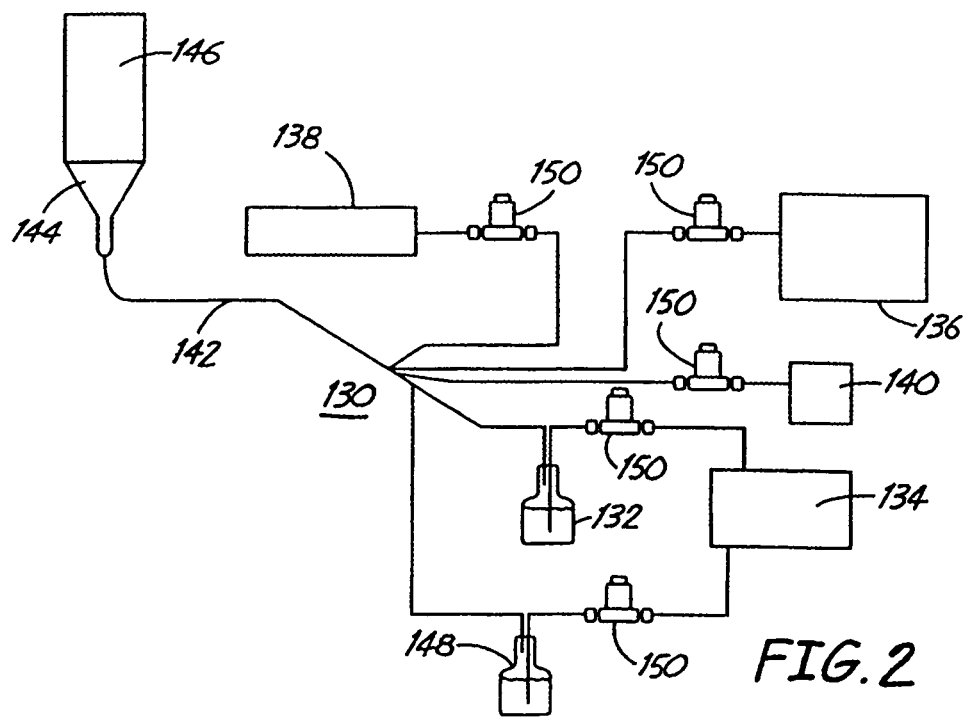
FIG. 2 is a schematic representation of a reactant delivery system for the delivery of vapor/gas reactants to a flowing reaction system, such as the laser pyrolysis reactor of FIG. 1.

Reactant inlet 102 is generally connected to a reactant delivery system. Referring to FIG. 2, an embodiment 130 of a reactant delivery apparatus includes a source 132 of a precursor compound. For liquid or solid reactants, an optional carrier gas from one or more carrier gas sources 134 can be introduced into precursor source 132 to facilitate delivery of the reactant. Precursor source 132 can be a liquid holding container, a solid precursor delivery apparatus or other suitable container. The carrier gas from carrier gas source 134 can be, for example, either an infrared absorber, an inert gas or mixtures thereof.

The gases/vapors from precursor source 132 can be mixed with gases from infrared absorber source 136, inert gas source 138 and/or gaseous reactant source 140 by combining the gases in a single portion of tubing 142. The gases/vapors are combined a sufficient distance from the reaction chamber such that the gases/vapors become well mixed prior to their entrance into the reaction chamber. The combined gas in tube 142 passes through a duct 144 into channel 146, which is in fluid communication with a reactant inlet, such as 102 in FIG. 1.

A second reactant precursor can be supplied as a vapor/gas from second reactant source 148, which can be a liquid reactant delivery apparatus, a solid reactant delivery apparatus, a gas cylinder or other suitable container or containers. As shown in FIG. 2, second reactant source 148 delivers a second reactant to duct 144 by way of tube 142. Alternatively, second reactant source can deliver the second reactant into a second duct such that the two reactants are delivered separately into the reaction chamber where the reactants combine at or near the reaction zone. Thus, for the formation of complex materials and/or dopants, a significant number of reactant sources and, optionally, separate reactant ducts can be used for reactant/precursor delivery. For example, as many as 25 reactant sources and ducts are contemplated, although in principle, even larger numbers could be used. Mass flow controllers 150 can be used to regulate the flow of gases/vapors within the reactant delivery system of FIG. 2. Additional reactants/precursors can be provided similarly for the synthesis of complex materials.

As noted above, the reactant stream can include one or more aerosols. The aerosols can be formed within the reaction chamber or outside of the reaction chamber prior to injection into the reaction chamber. If the aerosols are produced prior to injection into the reaction chamber, the aerosols can be introduced through reactant inlets comparable to those used for gaseous reactants, such as reactant inlet 102 in FIG. 1. For the formation of complex material, additional aerosol generators and/or vapor/gas sources can be combined to supply the desired composition within the reactant stream.

Figure 4:
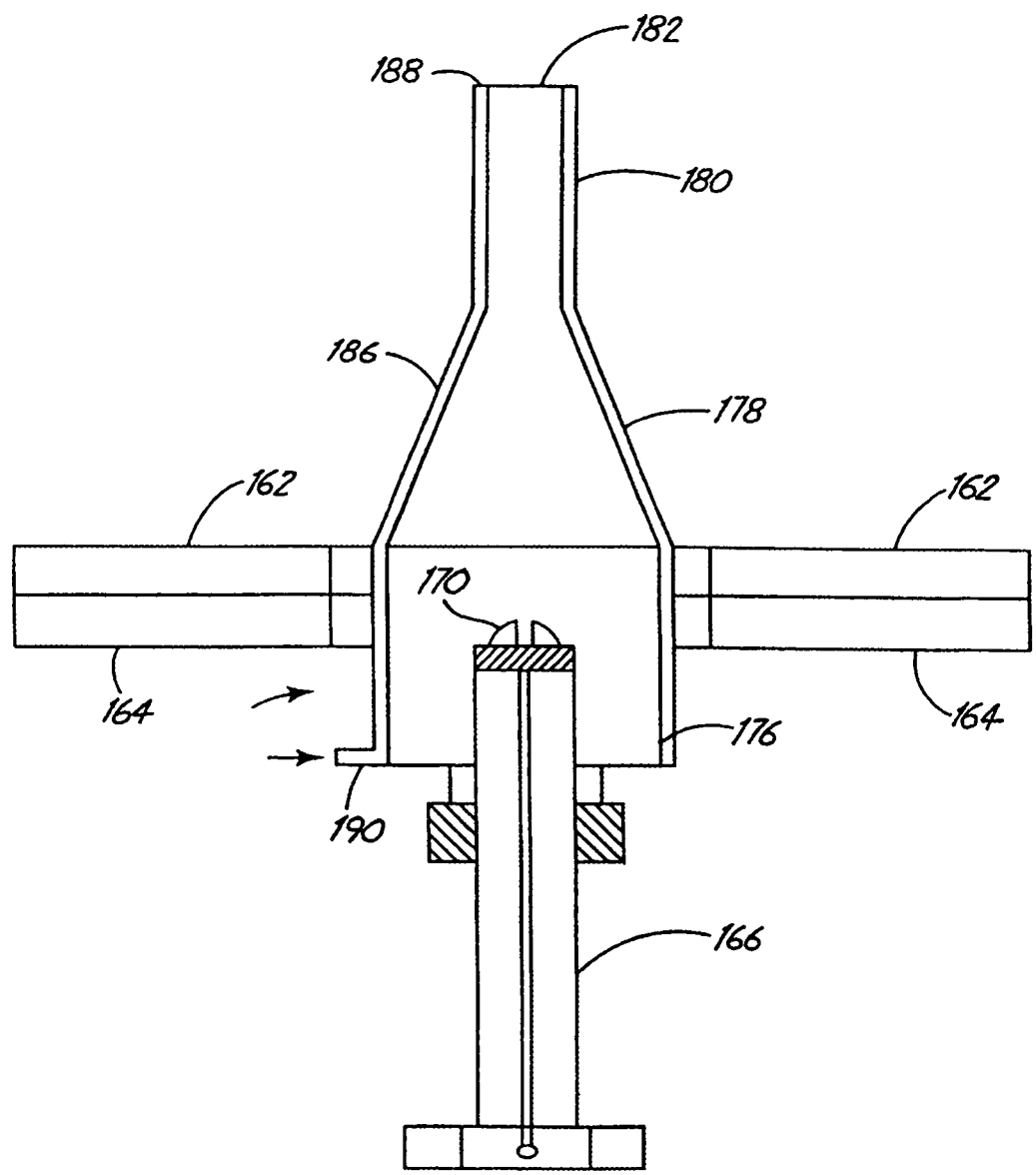
FIG. 4 is a sectional side view of the reactant inlet nozzle of FIG. 3 taken along the line 4-4 of the insert in FIG. 3.
Figure 5:
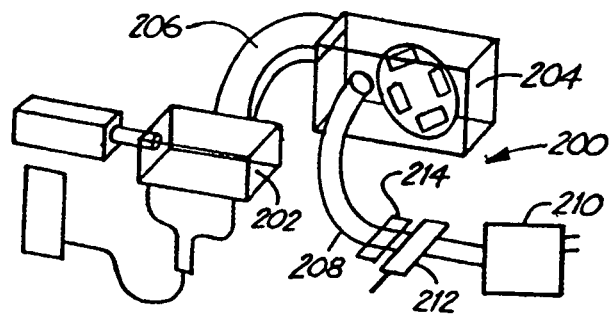
FIG. 5 is a schematic diagram of a light reactive deposition apparatus formed with a particle production apparatus connected to a separate coating chamber through a conduit.

An embodiment of a reactant delivery nozzle configured to deliver an aerosol reactant is shown in FIGS. 4 and 5. Inlet nozzle 160 connects with a reaction chamber at its lower surface 162. Inlet nozzle 160 includes a plate 164 that bolts into lower surface 162 to secure inlet nozzle 160 to the reaction chamber. Inlet nozzle 160 includes an inner nozzle 166 and an outer nozzle 168. Inner nozzle 166 can have, for example, a twin orifice internal mix atomizer 170 at the top of the nozzle. Suitable gas atomizers are available from Spraying Systems, Wheaton, Ill. The twin orifice internal mix atomizer 170 has a fan shape to produce a thin sheet of aerosol and gaseous compositions. Liquid is fed to the atomizer through tube 172, and gases for introduction into the reaction chamber are fed to the atomizer through tube 174. Interaction of the gas with the liquid assists with droplet formation.

Figure 3:
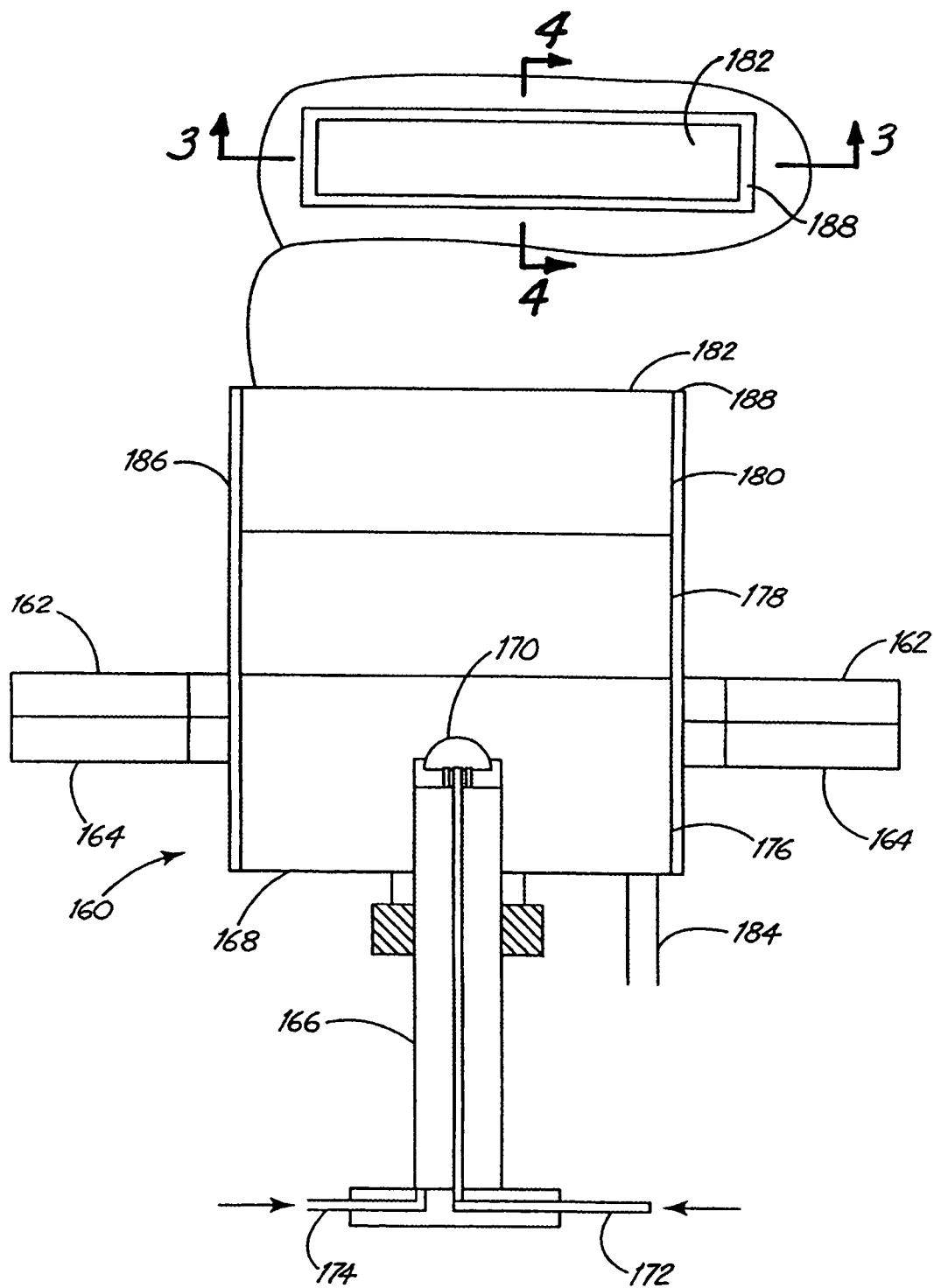
FIG. 3 is a sectional side view of a reactant inlet nozzle with an aerosol generator for the delivery of aerosol and gas/vapor compositions into a reaction chamber, wherein the cross section is taken along line 3-3 of the insert. The insert shows a top view of an elongated reactant inlet.

Outer nozzle 168 includes a chamber section 176, a funnel section 178 and a delivery section 180. Chamber section 176 holds the atomizer of inner nozzle 166. Funnel section 178 directs the aerosol and gaseous compositions into delivery section 180. Delivery section 180 leads to a rectangular reactant opening 182, shown in the insert of FIG. 3. Reactant opening 182 forms a reactant inlet into a reaction chamber for laser pyrolysis or light reactive deposition. Outer nozzle 168 includes a drain 184 to remove any liquid that collects in the outer nozzle. Outer nozzle 168 is covered by an outer wall 186 that forms a shielding gas opening 188 surrounding reactant opening 182. Inert shielding gas is introduced through tube 190. Additional embodiments for the introduction of an aerosol with one or more aerosol generators into an elongated reaction chamber is described in commonly assigned and copending U.S. Pat. No. 6,193,939 to Gardner et al., entitled "Reactant Delivery Apparatuses," incorporated herein by reference.

For the formation of oxides, suitable secondary reactants serving as an oxygen source include, for example, $O_2$, CO, $N_2O$, $H_2O$, $CO_2$, $O_3$ and mixtures thereof. Molecular oxygen can be supplied as air. Alternatively, oxygen can be provided in a metal/metalloid precursor compound, such as a carbonyl. Some sources of carbon for carbides, nitrogen for nitrides and sulfur for sulfides are described further below. A secondary reactant compound, if present, should not react significantly with the metal precursor prior to entering the reaction zone since this generally would result in the formation of large particles.

Laser pyrolysis/light reactive deposition can be performed with a variety of optical frequencies, using either a laser or other strong focused light source. Some desirable light sources operate in the infrared portion of the electromagnetic spectrum. $CO_2$ lasers are particularly convenient sources of light. Infrared absorbers for inclusion in the reactant stream include, for example, $C_2H_4$, isopropyl alcohol, $NH_3$, $SF_6$, $SiH_4$ and $O_3$. $O_3$ can act as both an infrared absorber and as an oxygen source. The radiation absorber, such as the infrared absorber, absorbs energy from the radiation beam and distributes the energy to the other reactants to drive the reaction.

Generally, the energy absorbed from the light beam increases the temperature at a tremendous rate, many times the rate that heat generally would be produced by exothermic reactions under controlled condition. While the process generally involves nonequilibrium conditions, the temperature can be described approximately based on the energy in the absorbing region. In light reactive deposition, the reaction process is qualitatively different from the process in a combustion reactor where an energy source initiates a reaction, but the reaction is driven by energy given off by an exothermic reaction. In a combustion reactor, there is generally no well-defined reaction zone with a boundary. The reaction zone is large and the residence time of the reactants is long. Lower thermal gradients are generally present in the combustion reactor. In contrast, the laser/light driven reactions have extremely high heating and quenching rates. The laser/light intensity is controllable such that the reaction conditions are similarly controllable. In light reactive deposition, the reaction zone is primarily at the overlap of the light beam and the reactant stream, although the reaction zone may extend a few millimeters beyond the light beam, depending on the precise character of the reaction. After leaving the reaction zone in a light reaction deposition reactor, the particles may still be somewhat fluid/soft due to their temperature even if the reaction has terminated.

An inert shielding gas can be used to reduce the amount of reactant and product molecules contacting the reactant chamber components. Inert gases can also be introduced into the reactant stream as a carrier gas and/or as a reaction moderator. Appropriate inert shielding gases include, for example, Ar, He and $N_2$.

Laser pyrolysis apparatuses can be adapted for light reactive deposition. The nature of the adaptation depends on whether or not the coating is performed in the reaction chamber or within a separate coating chamber. In any of the embodiments, the reactant delivery inlet into the reaction chamber generally is configured to deliver a reactant stream with dimensions that results in a product stream with desired dimensions for the deposition process. For example, in some embodiments, the reactant inlet has a length approximately the same size or slightly larger than the diameter of a substrate such that the substrate can be coated along an entire dimension of the substrate with one pass through the product stream without wasting excessive amount of product.

The outlet of a laser pyrolysis apparatus can be adapted for the coating of substrates within a separate coating chamber. A coating apparatus with separate reaction chamber and coating chamber is shown schematically in FIG. 5.

The coating apparatus 200 comprises a reaction chamber 202, a coating chamber 204, a conduit 206 connecting reaction chamber 202 with coating chamber 204, an exhaust conduit 208 leading from coating chamber 204 and a pump 210 connected to exhaust conduit 208. A valve 212 can be used to control the flow to pump 210. Valve 212 can be, for example, a manual needle valve or an automatic throttle valve. Valve 212 can be used to control the pumping rate and the corresponding chamber pressures. A collection system, filter, scrubber or the like 214 can be placed between the coating chamber 204 and pump 210 to remove particles that did not get coated onto the substrate surface.

Figure 6:
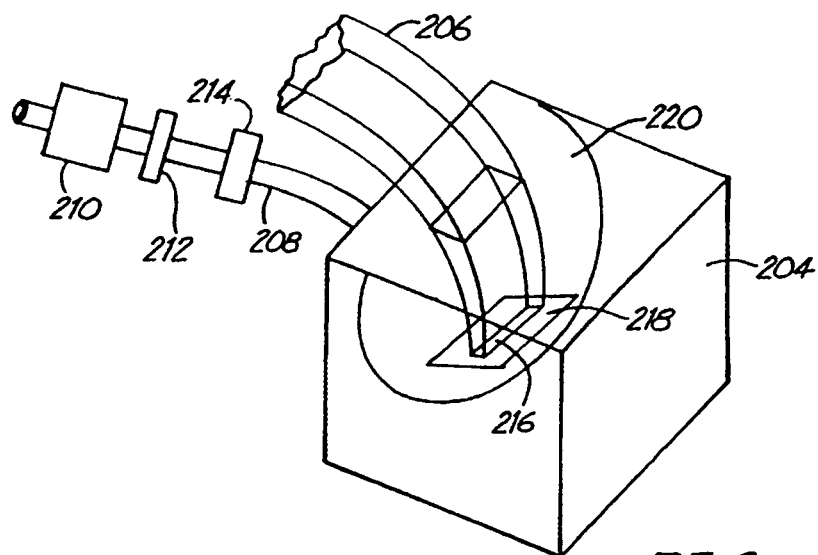
FIG. 6 is a perspective view of a coating chamber where the walls of the chamber are transparent to permit viewing of the internal components.

Referring to FIG. 6, conduit 206 from the particle production apparatus 202 leads to coating chamber 204. Conduit 206 terminates at opening 216 within chamber 204. In some embodiments, conduit opening 216 is located near the surface of substrate 218 such that the momentum of the particle stream directs the particles directly onto the surface of substrate 218. Substrate 218 can be mounted on a stage or other platform 220 to position substrate 218 relative to opening 216.

Figure 7:
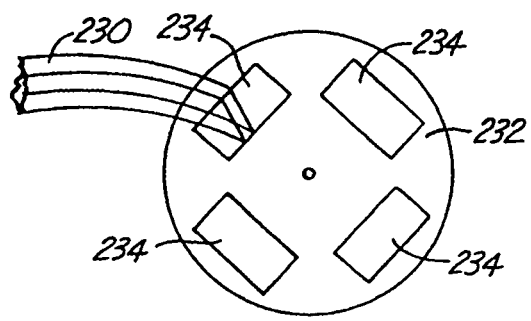
FIG. 7 is perspective view of a particle nozzle directed at a substrate mounted on a rotating stage.

An embodiment of a stage to position a substrate relative to the conduit from the particle production apparatus is shown in FIG. 7. A particle nozzle 230 directs particles toward a rotating stage 232. As shown in FIG. 7, four substrates 234 are mounted on stage 232. More or fewer substrates can be mounted on a moveable stage with corresponding modifications to the stage and size of the chamber. A motor is used to rotate stage 232.

Movement of stage 232 sweeps the particle stream across a surface of one particular substrate 234 within the path of nozzle 230. Stage 232 can be used to pass sequential substrates through the product stream for one or more coating applications to each substrate. Stage 232 can include thermal control features that provide for the control of the temperature of the substrates on stage 232. Alternative designs involve the linear movement of a stage or other motions. In other embodiments, the particle stream is unfocused such that an entire substrate or the desired portions thereof is simultaneously coated without moving the substrate relative to the product flow.

If the coating is performed within the reaction chamber, the substrate is mounted to receive product compositions flowing from the reaction zone. The compositions may not be fully solidified into solid particles, although quenching may be fast enough to form solid particles. Whether or not the compositions are solidified into solid particles, the particles can be highly uniform. The distance from the reaction zone to the substrate can be selected to yield desired coating results.

Figure 8:
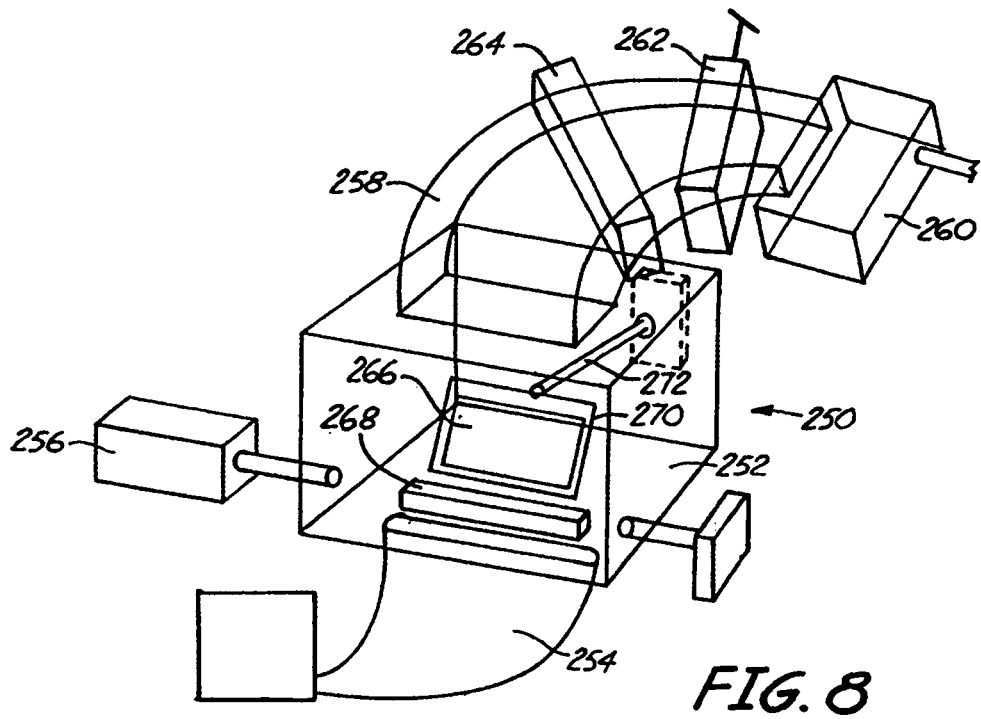
FIG. 8 is a schematic diagram of a light reactive deposition apparatus in which a particle coating is applied to a substrate within the particle production chamber.

An apparatus 250 to perform substrate coating within the reaction chamber is shown schematically in FIG. 8. The reaction/coating chamber 252 is connected to a reactant supply system 254, a radiation source 256 and an exhaust 258. Exhaust 258 can be connected to a pump 260, although the pressure from the reactant stream itself can maintain flow through the system. A valve 262 can be used to control the flow to pump 260. Valve 262 can be used to adjust the pumping rate and the corresponding chamber pressures. A collection system, filter, scrubber or the like 264 can be placed between chamber 252 and pump 260 to remove particles that did not get coated onto the substrate surface.

Substrate 266 can contact flow from a reaction zone 268 to coat the substrate with product particles/powders. Substrate 266 can be mounted on a stage, conveyor, or the like 270 to sweep substrate 266 through the flow. Stage 270 can be connected to an actuator arm 272 or other motorized apparatus to move stage 270 to sweep the substrate through the product stream. Various configurations can be used to sweep the coating across the substrate surface as the product leaves the reaction zone. A shown in FIG. 8, actuator arm 272 translates stage 270 to sweep substrate 266 through the product stream.

Figure 9:
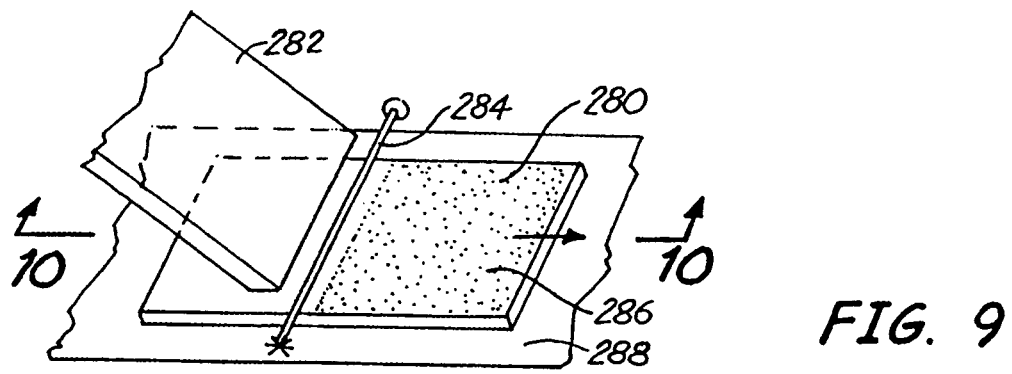
FIG. 9 is a perspective view of a reactant nozzle delivering reactants to a reaction zone positioned near a substrate.
Figure 10:
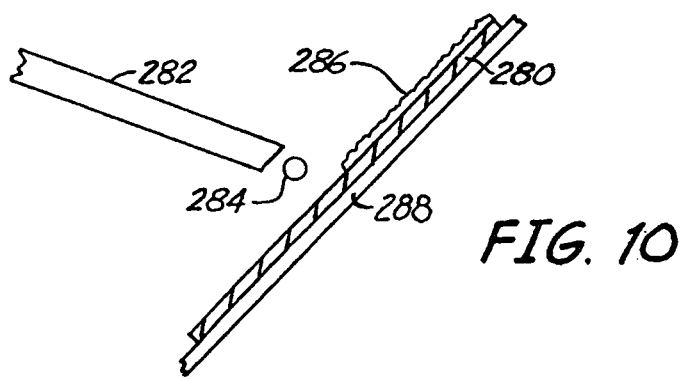
FIG. 10 is a sectional view of the apparatus of FIG. 9 taken along line 10-10.

A similar embodiment is shown in an expanded view in FIGS. 9 and 10. A substrate 280 moves relative to a reactant nozzle 282, as indicated by the right directed arrow. Reactant nozzle 282 is located just above substrate 280. An optical path 284 is defined by suitable optical elements that direct a light beam along path 284. Optical path 284 is located between nozzle 282 and substrate 280 to define a reaction zone just above the surface of substrate 280. The hot particles tend to attract to the cooler substrate surface.

Referring to FIGS. 9 and 10, a particle coating 286 is formed as the substrate is scanned past the reaction zone. In general, substrate 280 can be carried on a conveyor/stage 288. Conveyor/stage 288 can be connected to an actuator arm, as shown in FIG. 8. In alternative embodiments, rollers and a motor, a continuous belt conveyor, or any of a variety of design, including known designs, for translating a substrate can be used to carry the substrate.

In some embodiments, the position of conveyor 288 can be adjusted to alter the distance from substrate 286 to the reaction zone. Changes in the distance from substrate to the reaction zone correspondingly alter the temperature of the particles striking the substrate. The temperature of the particles striking the substrate generally alters the properties of the resulting coating and the requirements for subsequent processing, such as a subsequent heat processing consolidation of the coating. The distance between the substrate and the reaction zone can be adjusted empirically to produce desired coating properties. In addition, the stage/conveyor supporting the substrate can include thermal control features such that the temperature of the substrate can be adjusted to higher or lower temperatures, as desired.

Figure 11:
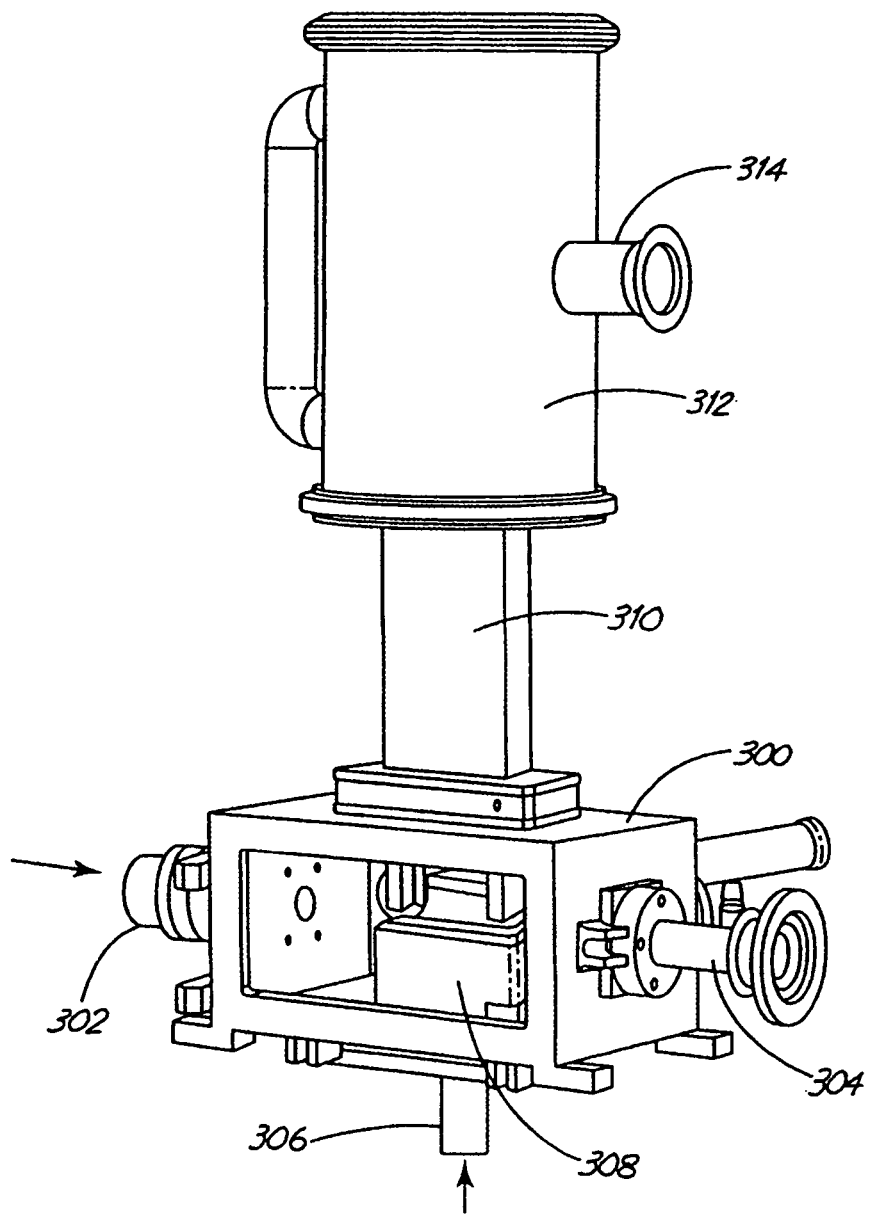
FIG. 11 is a perspective view of an embodiment of a light reactive deposition chamber.
Figure 12:
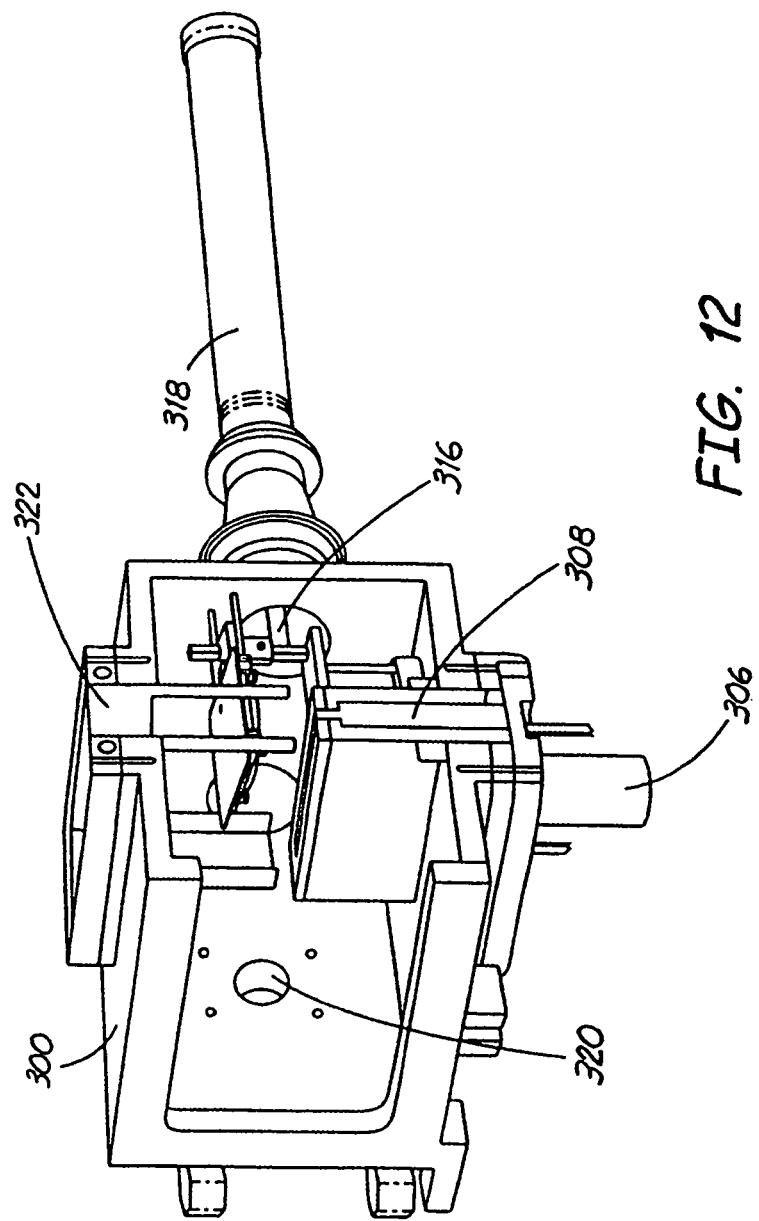
FIG. 12 is an expanded view of the reaction chamber of the light reactive deposition chamber of FIG. 11.
Figure 13:
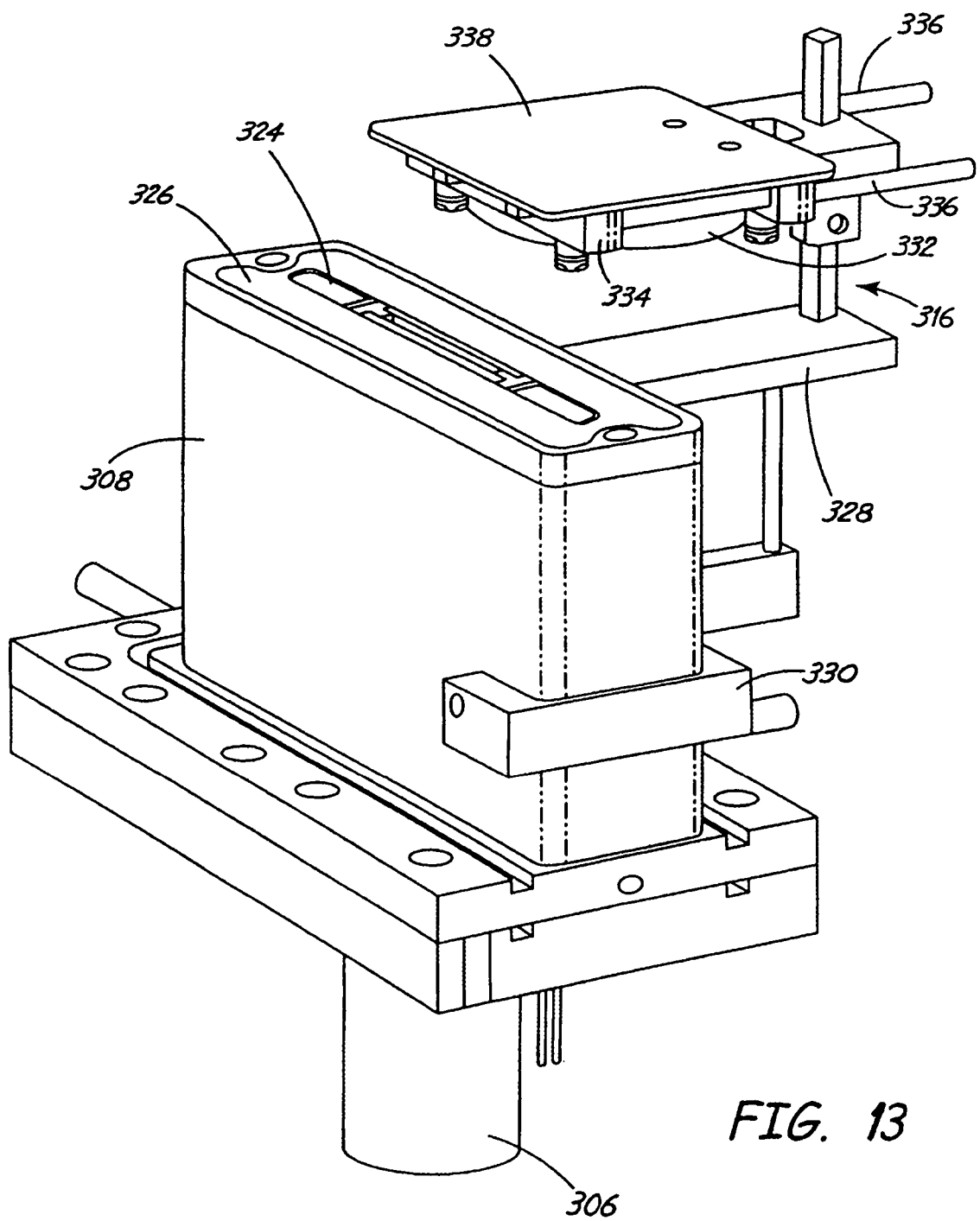
FIG. 13 is an expanded view of the substrate support of the reaction chamber of FIG. 12.

A particular embodiment of a light reactive deposition apparatus is shown in FIGS. 11-13. Referring to FIG. 11, process chamber 300 includes a light tube 302 connected to a $CO_2$ laser and a light tube 304 connected to a beam dump (not shown). An inlet tube 306 connects with a precursor delivery system that delivers vapor reactants and carrier gases. Inlet tube 306 leads to process nozzle 308. A particle transport tube 310 connects to process chamber 300 along the flow direction from process nozzle 308. Particle transport tube 310 leads to a particle filtration chamber 312. Particle filtration chamber 312 connects to a pump at pump connector 314.

An expanded view of process chamber 300 is shown in FIG. 12. A wafer carrier 316 supports a wafer above process nozzle 308. Wafer carrier 316 is connected with an arm 318, which translates the wafer carrier to move the wafer through the particle stream emanating from the reaction zone where the laser beam intersects the precursor stream from process nozzle 308. Arm 318 includes a linear translator that is shielded with a tube. A laser entry port 320 is used to direct a laser beam between process nozzle 308 and the wafer. Unobstructed flow from process nozzle would proceed directly to exhaust nozzle 322, which leads to particle transport tube 310.

An expanded view of wafer carrier 316 and process nozzle 308 is shown in FIG. 13. The end of process nozzle 308 has an opening for precursor delivery 324 and a shielding gas opening 326 around precursor opening to confine the spread of precursor and product particles. Wafer carrier 316 includes a support 328 that connects to process nozzle 308 with a bracket 330. A circular wafer 332 is held in a mount 334 such that wafer 332 slides within mount 334 along tracks 336 to move wafer 332 into the flow from the reaction zone. Backside shield 338 prevents uncontrolled deposition of particles on the back of wafer 332. Tracks 336 connect to arm 318.

The temperature of the substrate during the deposition process can be adjusted to achieve particular objectives. For example, the substrate can be cooled during the deposition process since a relatively cool substrate can attract the particles to its surface. However, in some embodiments, the substrate is heated, for example to about 500° C., during the deposition process. Particles stick better to a heated substrate. In addition, the particles tend to compact and fuse on a heated substrate such that a subsequent consolidation of the coating into a fused glass or other material is facilitated if the coating were formed initially on a heated substrate.

For the production of discrete devices or structures on a substrate surface formed by the coating formed by the coating process, the deposition process can be designed to only coat a portion of the substrate. For example, masking can be used during the coating process to only coat a selected portion of the substrate, or the mass flow controllers feeding reactants can be adjusted to vary the composition of the coating at selected locations along the substrate, as the substrate is moved through the product stream. For example, the deposition of stripes of material can be used to construct corresponding devices that can take advantage of the variation in composition. Thus, the deposition process itself can be manipulated to produce specific structures. Alternatively, various patterning approaches can be used. For example, conventional approaches from integrated circuit manufacturing, such as photolithography and dry etching, can be used to pattern the coating following deposition. Suitable patterns and optical devices are described further below.

The formation of coatings by light reactive deposition, silicon glass deposition and optical devices are described further in copending and commonly assigned U.S. patent application Ser. No. 09/715,935 now U.S. Pat. No. 7,575,784 to Bi et al., entitled "COATING FORMATION BY REACTIVE DEPOSITION," incorporated herein by reference, and in copending and commonly assigned PCT application designating the U.S. serial number PCT/US01/32413 to Bi et al., which was filed on Oct. 16, 2001, published as WO 02/32588, entitled "Coating Formation By Reactive Deposition," incorporated herein by reference.

Deposited Particles Coatings

The basic process for the deposition of particle coatings has been described in detail above. A variety of particles can be produced by laser pyrolysis/light reactive deposition. Adaptation of laser pyrolysis for the performance of light reactive deposition can be used to produce coatings of comparable compositions as the particles with selected compositions that can be produced by laser pyrolysis. Powders of particular interest include, for example, silicon particles, metal particles, and metal/metalloid compounds, such as, metal/metalloid oxides, metal/metalloid carbides, metal/metalloid nitrides, and metal/metalloid sulfides. For optical materials, some materials of particular interest include, for example, silicon oxide (silica), aluminum oxide, and titanium oxide. Generally, the powders include fine or ultrafine particles with particle sizes in the submicron or nanometer range. The particles may or may not partly fuse or sinter during the deposition.

Light reactive deposition is particularly suitable for the formation of highly uniform particles, especially nanoscale particles. In particular, light reactive deposition can produce a collection of particles of interest generally with an average diameter for the primary particles of less than about 500 nm, alternatively in the range(s) from about 3 nm to about 100 nm, similarly in the range(s) from about 3 nm to about 75 nm, and also in the range(s) from about 3 nm to about 50 nm. Persons of ordinary skill in the art will recognize that other ranges and subranges within these specific ranges are contemplated and are covered by the present disclosure.

Light reactive deposition, as described above, generally results in primary particles having a very narrow range of particle diameters. With aerosol delivery of reactants for light reactive deposition, the distribution of particle diameters can be particularly sensitive to the reaction conditions. Nevertheless, if the reaction conditions are properly controlled, a very narrow distribution of particle diameters can be obtained with an aerosol delivery system. However, broader distributions of primary particles sizes can also be obtained, if desired, by controlling the flow rates, reactant densities and residence times in light reactive deposition or using other flowing reaction systems.

Furthermore, in embodiments with highly uniform particles, effectively no primary particles have an average diameter greater than about 4 times the average diameter and in other embodiments 3 times the average diameter, and in further embodiments 2 times the average diameter. In other words, the particle size distribution effectively does not have a tall indicative of a small number of particles with significantly larger sizes. An effective cut off in the tail of the size distribution indicates that there are less than about 1 particle in $10^6$ have a diameter greater than a specified cut off value above the average diameter. Narrow size distributions, lack of a tail in the distributions and the roughly spherical morphology can be advantageous for obtaining highly uniform coatings and for highly uniform sintering.

Small particle size and particle uniformity do contribute overall to the uniformity of the resulting coating. In particular, the lack of particles significantly larger than the average, i.e., the lack of a tall in the particle size distribution, leads to a more uniform coating. In addition, the particles can have a very high purity level.

Light reactive deposition can be performed with gas/vapor phase reactants. Many metal/metalloid precursor compounds can be delivered into the reaction chamber as a gas. Metalloids are elements that exhibit chemical properties intermediate between or inclusive of metals and nonmetals. Metalloid elements include, for example, silicon, boron, arsenic, antimony, and tellurium. Appropriate metal/metalloid precursor compounds for gaseous delivery generally include metal compounds with reasonable vapor pressures, i.e., vapor pressures sufficient to get desired amounts of precursor gas/vapor into the reactant stream. The vessel holding liquid or solid precursor compounds can be heated to increase the vapor pressure of the metal precursor, if desired. Solid precursors generally are heated to produce a sufficient vapor pressure.

A carrier gas can be bubbled through a liquid precursor to facilitate delivery of a desired amount of precursor vapor. Similarly, a carrier gas can be passed over the solid precursor to facilitate delivery of the precursor vapor. In other embodiments, the carrier gas is mixed with the precursor vapor before delivery into the reaction zone. Suitable silicon precursors for vapor delivery include, for example, silicon tetrachloride ($SiCl_4$), trichlorosilane ($Cl_3HSi$), trichloromethyl silane $CH_3SiCl_3$, and tetraethoxysilane ($Si(OC_2H_5)_4$, also known as ethyl silane and tetraethyl silane). The chlorine in these representative precursor compounds can be replaced with other halogens, e.g., Br, I and F.

Suitable dopants for silicon oxide materials include, for example, boron, germanium, phosphorous, titanium, zinc and aluminum. Suitable boron precursors include, for example, boron trichloride ($BCl_3$), diborane ($B_2H_6$), and $BH_3$. Suitable phosphorous precursors include, for example, phosphine ($PH_3$), phosphorus trichloride ($PCl_3$), phosphorus oxychloride ($POCl_3$) and $P(OCH_3)_3$. Suitable germanium precursors include, for example, $GeCl_4$. Suitable titanium precursors include, for example, titanium tetrachloride ($TiCl_4$), and titanium isopropoxide ($Ti[OCH(CH_3)_2]_4$). Suitable liquid zinc precursor compounds include, for example, diethyl zinc ($Zn(C_2H_5)_2$) and dimethyl zinc ($Zn(CH_3)_2$). Suitable solid, zinc precursors with sufficient vapor pressure of gaseous delivery include, for example, zinc chloride ($ZnCl_2$). Suitable liquid, aluminum precursors include, for example, aluminum s-butoxide ($Al(OC_4H_9)_3$). A number of suitable solid, aluminum precursor compounds are available including, for example, aluminum chloride ($AlCl_3$), aluminum ethoxide ($Al(OC_2H_5)_3$), and aluminum isopropoxide ($Al[OCH(CH_3)_2]_3$). Precursors for other dopants and host materials can be similarly selected based on analogy with these specific precursors.

The use of exclusively gas phase reactants is somewhat limiting with respect to the types of precursor compounds that can be used conveniently. Thus, techniques can be used to introduce aerosols containing reactant precursors to the reaction zone. Improved aerosol delivery apparatuses for laser pyrolysis reaction systems are described further in commonly assigned and copending U.S. Pat. No. 6,193,936 to Gardner et al., entitled "Reactant Delivery Apparatuses," incorporated herein by reference. These aerosol delivery apparatuses can be adapted for performing light reactive deposition.

Using aerosol delivery apparatuses, solid precursor compounds can be delivered by dissolving the compounds in a solvent. Alternatively, powdered precursor compounds can be dispersed in a liquid/dispersant for aerosol delivery. Liquid precursor compounds can be delivered as an aerosol from a neat liquid, a multiple liquid dispersion or a liquid solution. A solvent/dispersant can be selected to achieve desired properties of the resulting solution/dispersion. Suitable solvents/dispersants include water, methanol, ethanol, isopropyl alcohol, other organic solvents and mixtures thereof. The solvent should have a desired level of purity such that the resulting particles have a desired purity level. Some solvents, such as isopropyl alcohol, are significant absorbers of infrared light from a $CO_2$ laser such that no additional laser absorbing compound may be needed within the reactant stream if a $CO_2$ laser is used as a light source.

If aerosol precursors are used, the liquid solvent/dispersant can be rapidly evaporated by the light beam in the reaction chamber such that a gas phase reaction can take place. Thus, the fundamental features of the laser pyrolysis reaction are unchanged by the presence of an aerosol. Nevertheless, the reaction conditions are affected by the presence of the aerosol.

A number of suitable solid, metal precursor compounds can be delivered as an aerosol from solution. Suitable silicon precursors for aerosol production include, for example, silicon tetrachloride $Si(Cl_4)$, which is soluble in ether, and trichlorosilane ($Cl_3HSi$), which is soluble in carbon tetrachloride. Suitable dopants can be delivered in an aerosol. For example, zinc chloride ($ZnCl_2$) and zinc nitrate ($Zn(NO_3)_2$) are soluble in water and some organic solvents, such as isopropyl alcohol. Similarly, a boron dopant can be delivered as an aerosol using ammonium borate ($(NH_4)_2B_4O_7$), which is soluble in water and various organic solvents. Precursors for other dopants and host materials can be similarly selected based on analogy with these specific precursors.

The precursor compounds for aerosol delivery are dissolved in a solution generally with a concentration greater than about 0.1 molar. Generally, the greater the concentration of precursor in the solution the greater the throughput of reactant through the reaction chamber. As the concentration increases, however, the solution can become more viscous such that the aerosol may have droplets with larger sizes than desired. Thus, selection of solution concentration can involve a balance of factors in the selection of a desired solution concentration.

Several different types of nanoscale particles have been produced by laser pyrolysis. Similar particles can be produced by light reactive deposition based on the description above. In particular, many materials suitable for the production of optical materials can be produced by light reactive deposition.

Exemplary such nanoscale particles can generally be characterized as comprising a composition including a number of different elements and present in varying relative proportions, where the number and the relative proportions vary as a function of the application for the nanoscale particles. Typical numbers of different elements include, for example, numbers in the range(s) from about 2 elements to about 15 elements, with numbers of 1, 2, 3, 4, 5, 6, 7, 8, 9, 10, 11, 12, 13, 14, and 15 being contemplated. General numbers of relative proportions include, for example, values in the range(s) from about 1 to about 1,000,000, with numbers of about 1, 10, 100, 1000, 10000, 100000, 1000000, and suitable sums thereof being contemplated.

Alternatively or in addition, such nanoscale particles can be characterized as having the following formula:

$$A_aB_bC_cD_dE_eF_fG_gH_hI_iJ_jK_kL_lM_mN_nO_o,$$

where each A, B, C, D, E, F, G, H, I, J, K, L, M, N, and O is independently present or absent and at least one of A, B, C, D, E, F, G, H, I, J, K, L, M, N, and O is present and is independently selected from the group consisting of elements of the periodic table of elements comprising Group 1A elements, Group 2A elements, Group 3B elements (including the lanthanide family of elements and the actinide family of elements), Group 4B elements, Group 5B elements, Group 6B elements, Group 7B elements, Group 8B elements, Group 1B elements, Group 2B elements, Group 3A elements, Group 4A elements, Group 5A elements, Group 6A elements, and Group 7A elements; and each a, b, c, d, e, f, g, h, i, j, k, l, m, n, and o is independently selected from a value in the range(s) from about 1 to about 1,000,000, with numbers of about 1, 10, 100, 1000, 10000, 100000, 1000000, and suitable sums thereof being contemplated.

For example, the production of silicon oxide nanoparticles is described in copending and commonly assigned U.S. patent application Ser. No. 09/085,514, now U.S. Pat. No. 6,726,990 to Kumar et al., entitled "Silicon Oxide Particles," incorporated herein by reference. This patent application describes the production of amorphous $SiO_2$. The production of titanium oxide nanoparticles and crystalline silicon dioxide nanoparticles is described in copending and commonly assigned, U.S. patent application Ser. No. 09/123,255, now U.S. Pat. No. 6,387,531 to Bi et al., entitled "Metal (Silicon) Oxide/Carbon Composites," incorporated herein by reference. In particular, this application describes the production of anatase and rutile $TiO_2$.

Amorphous nanoscale powders and glass layers with dopants, such as rare earth dopants and/or other metal dopants, are described in copending and commonly assigned U.S. Provisional Patent Application Ser. No. 60/313,588 to Home et al., entitled "Doped Glass Materials," incorporated herein by reference. Suitable dopants include rare earth metals, which can impart desirable modifications of properties, such as index-of-refraction. Powders and glass layers can be formed with complex compositions including a plurality of selected dopants in an amorphous material. The powders can be used to form optical materials and the like. The glass layers can be formed by directly depositing a uniform particle coating using light reactive deposition and subsequently consolidating the powder into a uniform glass layer.

Amorphous submicron and nanoscale particles can be produced with selected dopants, including rare earth metals, using laser pyrolysis and other flowing reactor systems. Using these approaches a variety of new materials can be produced. The dopants can be introduced at desired stoichiometries by varying the composition of the reactant stream. The dopants are introduced into an appropriate host glass forming material. By appropriately selecting the composition in the reactant stream and the processing conditions, submicron particles incorporating one or more metal or metalloid elements as glass-forming hosts with selected dopants can be formed. Since the host amorphous materials generally are oxides, an oxygen source should also be present in the reactant stream. The conditions in the reactor should be sufficiently oxidizing to produce the oxide materials. Similarly, light reactive deposition can be used to form highly uniform coatings of glasses with dopants including, for example, rare earth dopants and/or complex blends of dopant compositions.

Some metal/metalloid oxides are particularly desirable for optical applications and/or for their ability to consolidate the material into uniform glass layers. Suitable glass forming host oxides for doping include, for example, $TiO_2$, $SiO_2$, $GeO_2$, $Al_2O_3$, $P_2O_5$, $B_2O_3$, $TeO_2$, and combinations and mixtures thereof. While phosphorous is located in the periodic table near the metal elements, it is not generally considered a metalloid element. However, phosphorous in the form of $P_2O_5$ is a good glass former similar to some metalloid oxides, and doped forms of $P_2O_5$ can have desirable optical properties. For convenience, as used herein including in the claims, phosphorous is also considered a metalloid element.

Dopants can be introduced to vary properties of the amorphous particles and/or a resulting glass layer. For example, dopants can be introduced to change the index-of-refraction of the glass. For optical applications, the index-of-refraction can be varied to form specific optical devices that operate with light of a selected frequency range. Dopants can also be introduced to alter the processing properties of the material. In particular, some dopants change the flow temperature, i.e., the glass transition temperature, such that the glass can be processed at lower temperatures. Dopants can also interact within the materials. For example, some dopants are introduced to increase the solubility of other dopants. Rare earth dopants are desirable for their modification of optical properties of the resulting doped material. Rare earth doped glasses are useful in the production of optical amplifiers.

Particles of particular interest include amorphous compositions that form optical glasses with a plurality of dopants. In some embodiments, the one or plurality of dopants are rare earth metals. Rare earth metals are particularly desirable because of their modification of optical properties of the materials. If the particles are consolidated into a glass layer, the resulting material can have an index-of-refraction influenced by the rare earth dopants as well as other dopants. In addition, the rare earth dopants influence the optical absorption properties that can alter the application of the materials for the production of optical amplifiers and other optical devices. Rare earth metals include the transition metals of the group IIIb of the periodic table. Specifically, the rare earth elements include Sc, Y and the Lanthanide series. Other suitable dopants include elements of the actinide series. For optical glasses, the rare earth metals of particular interest as dopants, include, for example, Er, Yb, Nd, La, Y, Pr and Tm. Suitable non-rare earth metal dopants include, for example, Bi, Sb, Zr, Pb, Li, Na, K, Ba, W and Ca.

To form a uniform glass layer, a layer of amorphous particles can be consolidated. To consolidate the glass, the powders are heated to a temperature above their flow temperature. At these temperatures, the powders density to form a uniform layer of glass material. Incorporation of the dopants into the particles results in a distribution of the dopants through the densified material directly as a result of the powder deposition.

Material processing remains a significant consideration in the design of desired optical devices. For example, the composition and properties, such as density, of a material are adjusted to obtain materials with a desired index-of-refraction. Similarly, the thermal expansion and flow temperatures of a material have to be consistent with a reasonable processing approach for forming the materials into a monolithic, integrated structure. The consolidated optical materials can have good optical properties such that light transmission through the materials does not result in undesirable amount of loss. In addition, the materials have to be processable under reasonable conditions to form the integrated devices of the integrated optical circuit or electro-optical circuit. Similar material constraints can be problematic for the formation of state-of-the-art integrated electronic devices.

Doped glasses are useful in the production of optical devices. Using the techniques described herein, the doped glasses can be formulated into planar optical devices. The dopant can change the optical properties of the materials to be particularly suitable for particular optical applications. Doped compositions, especially doped silicon oxides can be produced by introducing appropriate precursors. For example, a convenient approach to the production of an optical layer with a higher index of refraction is to use a doped silicon oxide. Suitable dopants include, for example, titanium oxide, tantalum oxide, tin oxide, niobium oxide, zirconium oxide, aluminum oxide, lanthanum oxide, germanium oxide, boron oxide or combinations thereof.

Some silicon oxide dopants also significantly lower the flow temperature of the material. In particular, boron and phosphorous dopants can help to lower the viscosity and therefore the flow temperature of silicon oxide. Boron dopants also lower the index-of-refraction while phosphorous dopants raise the index-of-refraction.

Rare earth doped glasses are particularly suitable for use in the formation of optical amplifiers. The amplifier material is excited by a pump light signal transversely coupled to the optical material. The pump light excites the rare earth doped materials. An optical input passing through the optical material at a lower frequency than the pump signal is then amplified by stimulated emission. Thus, energy from the pump light is used to amplify the input light signal.

In particular, nanoscale manganese oxide particles have been formed. The production of these particles is described in copending and commonly assigned U.S. patent application Ser. No. 09/188,770, now U.S. Pat. No. 6,506,493 to Kumar et al., entitled "Metal Oxide Particles," incorporated herein by reference. This application describes the production of MnO, $Mn_2O_3$, $Mn_3O_4$ and $Mn_5O_8$.

Also, the production of vanadium oxide nanoparticles is described in U.S. Pat. No. 6,106,798 to Bi et al., entitled "Vanadium Oxide Nanoparticles," incorporated herein by reference. Similarly, silver vanadium oxide nanoparticles have been produced, as described in copending and commonly assigned U.S. patent application Ser. No. 09/246,076 to Home et al., now U.S. Pat. No. 6,225,007, and Ser. No. 09/311,506 to Reitz et al., now U.S. Pat. No. 6,391,494, both entitled "Metal Vanadium Oxide Particles," both of which are incorporated herein by reference.

Furthermore, lithium manganese oxide nanoparticles have been produced by laser pyrolysis along with or without subsequent heat processing, as described in copending and commonly assigned U.S. patent application Ser. No. 09/188,768, now U.S. Pat. No. 6,607,706 to Kumar et al., entitled "Composite Metal Oxide Particles," and Ser. No. 09/334,203, now U.S. Pat. No. 6,482,374 to Kumar et al., entitled "Reaction Methods for Producing Ternary Particles," and U.S. Pat. No. 6,136,287 to Home et al., entitled "Lithium Manganese Oxides and Batteries," all three of which are incorporated herein by reference.

The production of aluminum oxide nanoparticles is described in copending and commonly assigned, U.S. patent application Ser. No. 09/136,483, now published as U.S. 2009/0255189 to Kumar et al., entitled "Aluminum Oxide Particles," incorporated herein by reference. In particular, this application disclosed the production of $\gamma$-$Al_2O_3$. The formation of delta-$Al_2O_3$ and theta-$Al_2O_3$ by laser pyrolysis/light reactive deposition along with doped-crystalline and amorphous alumina is described in copending and commonly assigned U.S. patent application Ser. No. 09/969,025, now published as U.S. 2003/0077221 to Chiruvolu et al., entitled "Aluminum Oxide Powders," incorporated herein by reference. Amorphous aluminum oxide materials can be combined with other glass formers, such as $SiO_2$ and/or $P_2O_3$. For example, suitable metal oxide dopants for aluminum oxide for optical glass formation include cesium oxide ($Cs_2O$), rubidium oxide ($Rb_2O$), thallium oxide ($Tl_2O$), lithium oxide ($Li_2O$), sodium oxide ($Na_2O$), potassium oxide ($K_2O$), beryllium oxide (BeO), magnesium oxide (MgO), calcium oxide (CaO), strontium oxide (SrO) and barium oxide (BaO). Glass dopants can affect, for example, the index-of-refraction, sintering temperature and/or the porosity of the glass. Suitable metal oxide dopants for infrared emitters include, for example, cobalt oxide ($Co_3O_4$).

In addition, tin oxide nanoparticles have been produced by laser pyrolysis, as described in copending and commonly assigned U.S. patent application Ser. No. 09/042,227, now U.S. Pat. No. 6,200,674 to Kumar et al., entitled "Tin Oxide Particles," incorporated herein by reference. The production of zinc oxide nanoparticles is described in copending and commonly assigned U.S. patent application Ser. No. 09/266,202 now U.S. Pat. No. 7,423,512 to Reitz, entitled "Zinc Oxide Particles," incorporated herein by reference. In particular, the production of ZnO nanoparticles is described.

Rare earth dopants can be introduced into metal compositions using light reactive deposition and laser pyrolysis. In particular, submicron and nanoscale particles and corresponding coatings of rare earth metal oxide particles, rare earth doped metal/metalloid oxide particles, rare earth metal/metalloid sulfides and rare earth doped metal/metalloid sulfides, especially crystalline powders and coatings, are described in copending and commonly assigned U.S. patent application Ser. No. 09/843,195, now U.S. Pat. No. 6,692,660 to Kumar et al, entitled "High Luminescence Phosphor Particles," incorporated herein by reference. Suitable host materials for the formation of phosphors include, for example, ZnO, ZnS, $Zn_2SiO_4$ SrS, $YBO_3$, $Y_2O_3$, $Al_2O_3$, $Y_3Al_5O_{12}$ and $BaMgAl_{14}O_{23}$. Exemplary non-rare earth metals for activating phosphor particles as dopants include, for example, manganese, silver and lead. Exemplary rare earth metals for forming metal oxide phosphors include, for example, europium, cerium, terbium and erbium. Generally, heavy metal ions or rare earth ions are used as activators in phosphors. For phosphor applications, the particles are generally crystalline. The incorporation of rare earth and other dopants into amorphous particles and coating is described further in copending and commonly assigned U.S. Provisional Patent Application Ser. No. 60/313,588 to Horne et al., entitled "Doped Glass Materials," incorporated herein by reference. The composition of complex, doped and undoped optical materials is described also in copending and commonly assigned PCT Application designating the U.S. serial number PCT/US01/32413, now published as WO 02/32588 to Bi et al., which was filed on Oct. 16, 2001, entitled "Coating Formation By Reactive Deposition," incorporated herein by reference.

The production of iron, iron oxide and iron carbide is described in a publication by Bi et al., entitled "Nanocrystalline α-Fe, $Fe_3C$, and $Fe_7C_3$ produced by $CO_2$ laser pyrolysis," J. Mater. Res. Vol. 8, No. 7 1666-1674 (July 1993), incorporated herein by reference. The production of nanoparticles of silver metal is described in copending and commonly assigned U.S. patent application Ser. No. 09/311,506, now U.S. Pat. No. 6,391,494 to Reitz et al., entitled "Metal Vanadium Oxide Particles," incorporated herein by reference. Nanoscale carbon particles produced by laser pyrolysis is described in a reference by Bi et al., entitled "Nanoscale carbon blacks produced by $CO_2$ laser pyrolysis," J. Mater. Res. Vol. 10, No. 11, 2875-2884 (November 1995), incorporated herein by reference.

The production of iron sulfide ($Fe_{1-x}S$) nanoparticles by laser pyrolysis is described in Bi et al., Material Research Society Symposium Proceedings, vol. 286, p. 161-166 (1993), incorporated herein by reference. Precursors for laser pyrolysis production of iron sulfide were iron pentacarbonyl ($Fe(CO)_5$) and hydrogen sulfide ($H_2S$).

Cerium oxide can be produced using the laser pyrolysis apparatuses described above. Suitable precursors for aerosol delivery include, for example, cerous nitrate ($Ce(NO_3)_3$), cerous chloride ($CeCl_3$) and cerous oxalate ($Ce_2(C_2O_4)_3$). Similarly, zirconium oxide can be produced using the laser pyrolysis apparatuses described above. Suitable zirconium precursors for aerosol delivery include, for example, zirconyl chloride ($ZrOCl_2$) and zirconyl nitrate ($ZrO(NO_3)_2$).

The deposition of coatings of dielectric materials for chip capacitors is described in copending and commonly assigned U.S. Provisional Patent Application Ser. No. 60/312,234 to Bryan, entitled "Reactive Deposition For The Formation Of Chip Capacitors," incorporated herein by reference. Particularly suitable dielectric materials include a majority of barium titanate ($BaTiO_3$), optionally mixed with other metal oxides. Other dielectric oxides suitable for incorporation into ceramic chip capacitors with appropriate dopants include, for example, $SrTiO_3$, $CaTiO_3$, $SrZrO_3$, $CaZrO_3$, $Nd_2O_3$-$2TiO_3$ and $La_2O_3$-$2TiO_2$.

The production of ternary nanoparticles of aluminum silicate and aluminum titanate can be performed by laser pyrolysis following procedures similar to the production of silver vanadium oxide nanoparticles described in copending and commonly assigned U.S. patent application Ser. No. 09/311,506, now U.S. Pat. No. 6,391,494 to Reitz et al., entitled "Metal Vanadium Oxide Particles," incorporated herein by reference. Suitable precursors for the production of aluminum silicate include, for vapor delivery, a mixture of aluminum chloride ($AlCl_3$) and silicon tetrachloride ($SiCl_4$) and, for aerosol delivery, a mixture of tetra(N-butoxy) silane and aluminum isopropoxide ($Al(OCH(CH_3)_2)_3$). Similarly, suitable precursors for the production of aluminum titanate include, for aerosol delivery, a mixture of aluminum nitrate ($Al(NO_3)_3$) and titanium dioxide ($TiO_2$) powder dissolved in sulfuric acid or a mixture of aluminum isopropoxide and titanium isopropoxide ($Ti(OCH(CH_3)_2)_4$).

The formation of submicron and nanoscale particles along with coatings of metal/metalloid compounds with complex anions is described in copending and commonly assigned U.S. patent application Ser. No. 09/845,985 now published as U.S. 2002/0192137 to Chaloner-Gill et al., entitled "Phosphate Powder Compositions And Methods For Forming Particles With Complex Anions," incorporated herein by reference. Suitable complex anions include, for example, phosphates, silicates and sulfates. The compositions can include multiple metal/metalloid elements.

The synthesis by laser pyrolysis of silicon carbide and silicon nitride is described in copending and commonly assigned U.S. patent application Ser. No. 09/433,202 to Reitz et al., entitled "Particle Dispersions," incorporated herein by reference. For the production of silicon nitride, ammonia ($NH_3$) was the nitrogen source. For the production of silicon carbide particles, diethoxysilane was decomposed to form the particles.

To obtain particular objectives, the features of the coating can be varied with respect to composition of layers of the powders as well as location of materials on the substrate. In addition, multiple layers of particles can be deposited in a controlled fashion to form layers with different compositions and/or optical properties. Generally, to form an optical device the uniform optical material is localized to a particular location on the substrate. Localization of a uniform material can involve selected deposition of the material at a particular location or etching following deposition. The procedures described above can be adapted to apply the coating to desired sections, for example by sweeping the substrate relative to the particle nozzle such that only the desired portion of the substrate is swept past the nozzle. Etching is described further below.

Similarly, the coating can be made a uniform thickness, or different portions of the substrate can be coated with different thicknesses of particles. Different coating thicknesses can be applied by varying the sweep speed of the substrate relative to the particle nozzle or by making multiple sweeps of portions of the substrate that receive a thicker particle coating. The particle composition can be similarly varied over different portions of the substrate. This can be accomplished, for example, by changing the reactant stream during the coating process, or by performing multiple partial coating sweeps over different portions of the substrates.

Thus, layers of materials, as described herein, may include particular layers that do not have the same planar extent as other layers. Thus, some layers may cover the entire substrate surface or a large fraction thereof while other layers cover a smaller fraction of the substrate surface. In this way, the layers can form one or more localized devices. At any particular point along the planar substrate, a sectional view through the structures may reveal a different number of identifiable layers than at other point along the surface.

Consolidation/Densification Process

Heat treatment can melt and fuse the particles and lead to compaction, i.e., densification, of the powders to form the desired material, especially optical material. This fusing of the particles is generally referred to as consolidation. To consolidate the optical materials, the materials can be heated to a temperature above the melting point or the flow temperature, i.e., glass transition temperature, of the material to consolidate the coating into a smooth uniform material.

Generally, the heating is performed under conditions to melt the particles into a viscous liquid. Because of the high viscosity, the material does not flow significantly on the substrate surface. Processing at higher temperatures to reduce the viscosity of the melt can result in undesirable melting of the substrate, migration of compositions between layers or in flow from a selected area of the substrate. The heating and quenching times can be adjusted to change the properties of the consolidated coatings, such as density. In addition, heat treatment can remove undesirable impurities and/or change the stoichiometry and crystal structure of the material.

Suitable processing temperatures and time generally depend on the composition of the particles. Small particles on the nanometer scale generally can be processed at lower temperatures and/or for shorter times relative to powders with larger particles due to lower melting points for the nanoparticles in comparison with bulk material. However, it may be desirable to use a comparable melting temperature to obtain greater surface smoothness from improved melting of the nanoparticles.

For the processing of silicon oxide nanoparticles, the particle coatings can be heated to a temperature on the order of 1200° C. Dopants in the silicon oxide particles can lower the appropriate consolidation temperatures. Some dopants affect the flow temperature as well as the optical properties. Thus, the dopant can be selected to flow into a uniform optical material at a lower temperature. Suitable dopants to lower the flow temperature when placed into silicon oxide ($SiO_2$) include, for example, boron, phosphorous, germanium, and combinations thereof. The amount and composition of one or more dopants can be selected to yield a desired flow temperature and index-of-refraction.

Heat treatments can be performed in a suitable oven. It may be desirable to control the atmosphere in the oven with respect to pressure and/or the composition of the gases. Suitable ovens include, for example, an induction furnace or a tube furnace with gas flowing through the tube. The heat treatment can be performed following removal of the coated substrates from the coating chamber. In alternative embodiments, the heat treatment is integrated into the coating process such that the processing steps can be performed sequentially in the apparatus in an automated fashion.

For many applications, it is desirable to apply multiple particle coatings with different compositions. In general, these multiple particle coatings can be arranged adjacent to each other across the x-y plane of the substrate being coated (e.g., perpendicular to the direction of motion of the substrate relative to the product stream), or stacked one on top of the other across the z plane of the substrate being coated, or in any suitable combination of adjacent and stacked layers. Each coating can be applied to a desired thickness. For example, in some embodiments, silicon oxide and doped silicon oxide can be deposited in alternating layers. Similarly, distinct layers of silicon oxide with different dopants can be deposited in alternating layers. Specifically, two layers with different compositions can be deposited with one on top of the other, and or additionally or alternatively, with one next to the other, such as layer A and layer B formed as AB. In other embodiments, more than two layers each with different compositions can be deposited, such as layer A, layer B and layer C deposited as three sequential (e.g., stacked one on top of the other, or adjacent to the other, or adjacent and stacked) layers ABC. Similarly, alternating sequences of layers with different compositions can be formed, such as ABABAB . . . or ABCABCABC . . . .

For many applications, the desirability of applying multiple particle coatings with different compositions (e.g., adjacent to each other, or stacked one on top of the other) can be suggested by functional requirement(s) for the coated substrate. Thus, for example, in optical applications, it can be desirable to apply multiple coatings with different compositions to achieve one, or any suitable combination of two or more of, the following functions: three-dimensional optical memory device, optical waveguide/conduit/fiber (e.g., Bragg grating), optical attenuator, optical splitter/coupler, optical filter, optical switch, laser, modulator, interconnect, optical isolator, optical add-drop multiplexer (OADM), optical amplifier, optical polarizer, optical mirror/reflector, optical phase-retarder, and optical detector.

Individual uniform layers after consolidation generally have an average thickness of less than 100 microns, in many embodiments from about 1 micron to about 50 microns, in other embodiments from about 3 microns to about 20 microns. A person of skill in the art will recognize that ranges within these specific ranges are contemplated and are within the scope of the present disclosure. Thicknesses are measured perpendicular to the projection plane in which the structure has a maximum surface area.

The material with multiple particle coatings can be heat treated after the deposition of each layer or following the deposition of multiple layers or some combination of the two approaches. The optimal processing order generally would depend on the melting point of the materials. Generally, however, it is desirable to heat treat and consolidate a plurality of layers simultaneously. If the heating temperatures are picked at reasonable values, the melted materials remain sufficiently viscous that the layers do not merge undesirable amounts at the interface. Slight merging of the layers generally does not affect performance unacceptable amounts.

Etching and Device Formation

For the production of discrete devices or structures within a layer formed by the coating formed by the coating process, the deposition process can be designed to only coat a portion of the layer with a particular composition. Alternatively, various patterning approaches can be used. For example, conventional approaches from integrated circuit manufacturing, such as photolithography and etching, can be used to pattern the coating following deposition.

Before or after patterning, the coating can be heat processed to transform the coating from a layer of discrete particles into a continuous layer. In some embodiments, particles in the coating are heated to consolidate the particles into a glass or a uniform crystalline layer. Silica glasses can be used for optical applications. Crystalline aluminum oxide, e.g., sapphire, and crystalline $SiO_2$, e.g., quartz, may be suitable for optical applications at certain light wavelengths. In addition, crystalline silicon can be used in the formation of silicon-on-insulator electronic components. The consolidation process generally is described in detail above.

Selective deposition of powder material and/or selective removal of material can be used to form desired structures within a layer of optical material. Based on the disclosure above, suitable selective deposition can involve, for example, selective deposition through a mask, movement of the substrate through the product particle stream to form coatings over only a portion of the substrate, varying the composition during the formation of a single coating layer or a combination thereof. These approaches result in the selective placement of particular compositions at selective positions within a layer while other compositions can be placed at other locations. In addition, the optical layer can be etched to form patterns of the optical material. In particular, to form a patterned structures, patterning approaches, such as photolithography, along with etching, such as chemical etching or radiation-based etching, can be used to form desired patterns in one or more layers by the selective removal of material. Thus, the composition and optical properties can very within a layer and between layers.

Figure 14:
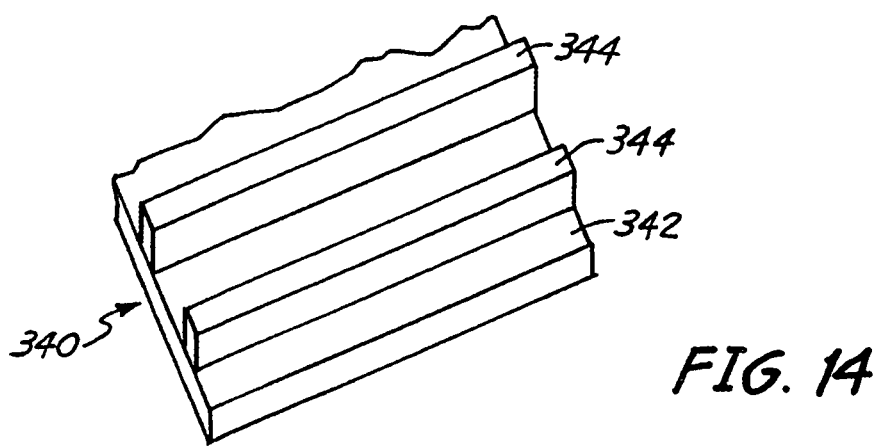
FIG. 14 is a perspective view of a patterned layer of optical material.
Figure 15:
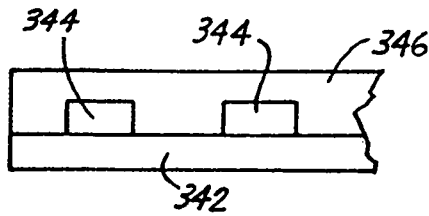
FIG. 15 is a side view of the material of FIG. 14 following deposition of an overcladding layer.

For example, after the deposition of two or more layers, controlled deposition or an etching step can be performed to create a structure shown schematically in FIG. 14. The layers can be deposited using light reactive deposition. Contoured optical structure 340 includes one or more support layers 342 and one or more contoured optical structures 344 on support layers 342. Channels 344 are formed by patterning a layer on top of support layers 342 to remove material between channels 344. An additional optical material 346 is generally placed over channels 344, as shown in FIG. 15. Heat treatments can be performed at appropriate points including before and/or after patterning and etching. Additional planarization, such as chemical-mechanical polishing, can be performed also.

While the multilayered optical coatings described herein can have a variety of applications, optical devices formed on a substrate surface are of particular interest. The control of light propagation along the optical devices requires variation in the index-of-refraction in adjacent materials. A device can be distinguished by boundaries of a material with an index-of-refraction or structure that is different from adjacent materials. A basic feature of the optical devices is that they are produced from a crystalline or amorphous material that is transparent to the electromagnetic radiation within a particular wavelength range to be transmitted through the device.

Optical devices of interest include, for example, optical waveguide devices, such as optical couplers, splitters, arrayed waveguide grating (AWG) and the like. Waveguides manufactured on a substrate surface are referred to as planar waveguides. Planar waveguides are useful in the production of integrated optical circuits for optical communication and other opto-electronics applications. Other optical devices of interest include, for example, three-dimensional optical memory device, optical fiber, Bragg grating, optical attenuator, optical filter, optical switch, laser, modulator, interconnect, optical isolator, optical add-drop multiplexer (OADM), optical amplifier, optical polarizer, optical mirror/reflector, optical phase-retarder, and optical detector.

Light propagates through a material having a higher refractive index than the surroundings. In some suitable embodiments, the planar waveguides have a thickness roughly on the order of the wavelength of the light, i.e., electromagnetic radiation, to be transmitted along the waveguide. For example, for 1.5 micron light, a thickness or about 6 microns would be reasonable for the waveguide. In general, thickness of optical layers In some embodiments, waveguides do not significantly attenuate the light transmitted through the material over moderate distances.

To produce a planar optical waveguide by particle coating technology, generally three layers are deposited. A core layer forms a light channel surrounded by an under-cladding layer, and a over-cladding layer. The under-cladding layer generally is applied between a substrate or underlying optical material and the core layer. In other words, the core layer generally is formed between two other optical materials to provide suitable optical transmission through the core material.

Figure 16:
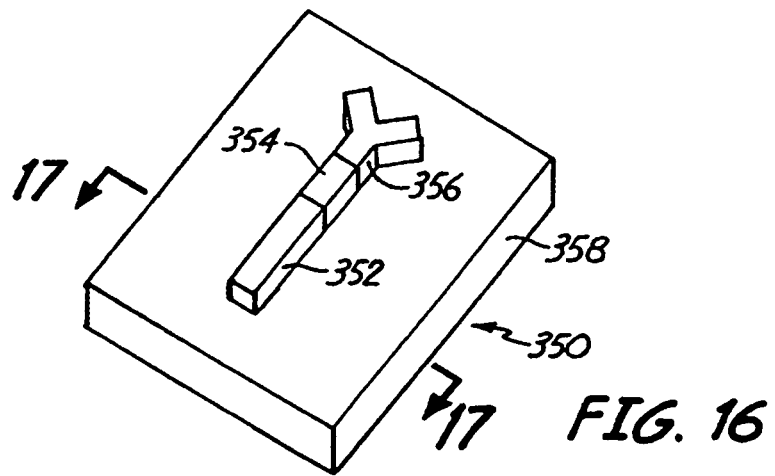
FIG. 16 is a perspective view of an optical circuit.
Figure 17:
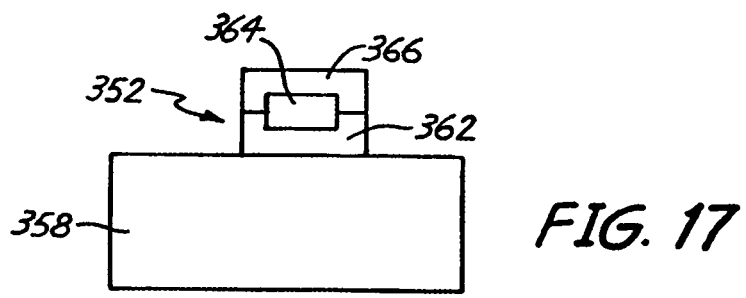
FIG. 17 is a sectional view of the optical circuit of FIG. 16 taken along line 17-17.

An optical circuit on a substrate is shown schematically in FIGS. 16 and 17. As shown in FIG. 16, optical circuit 350 includes optical devices 352, 354, 356 on substrate 358. A sectional view including optical device 352 is shown in FIG. 17. Optical device 352 includes an undercladding optical material 362, a core optical material 364 and an overcladding optical material 366. In general, core optical material 364 can be different from undercladding optical material 362 and overcladding optical material 366 in any optical property, such as index-of-refraction, which may be the result of, for example, a compositional difference, a density difference, or a crystal structure difference. Undercladding optical material 362 may or may not be different from overcladding optical material 366 in composition and/or optical properties. Overcladding material 366 is located along two layers, a layer shared with the core optical material and an overlying layer.

Substrate 358 can be formed from silicon. Common substrates are round wafers, although substrates that are square or other shapes can be used. For the formation of preforms, it may be desirable to shape the substrate highly elongated in one dimension. The aspect ratio may range from about 1:5 to about 1:50, or in other embodiments from about 1:10 to about 1:25. A person of ordinary skill in the art will recognize that ranges and subranges within these explicit ranges are contemplated and are within the present disclosure. Similarly, for preforms it may be desirable to have coatings with dimensions that change as further coatings are added such that the final structure does not have a rectangular shape to facilitate pulling of the fiber from the preform. Substrateless planar structures are also contemplated, as described further below. For these embodiments, a projection of the planar device to obtain a maximum area provides a planar extent of the device. This projected planar extent establishes a plane analogous to the substrate surface for orienting a position along the planar surface.

In some embodiments, the optical materials are formed from silica-based glasses. In these embodiments, an under-cladding layer of doped silicon dioxide is deposited over the substrate. A core layer of different doped silicon dioxide powder is then deposited over the cladding layer. The under-cladding layer generally is consolidated prior to the addition of an additional layer, although both layers can be consolidated simultaneously if the heat treatment is performed under suitable conditions. A convenient approach to the production of a core layer with a higher index of refraction is to use a doped silicon oxide. Suitable dopants include, for example, titanium oxide, tantalum oxide, tin oxide, lead oxide, lithium oxide, sodium oxide, bismuth oxide, potassium oxide, antimony oxide, calcium oxide, barium oxide, tungsten oxide, niobium oxide, zirconium oxide, aluminum oxide, lanthanum oxide, other rare earth dopants, such as, Er, Yb, Nd, Y, Pr and Tm, germanium oxide, boron oxide or combinations thereof. Generally, the under-cladding layer and the over-cladding layer can be produced with doped silicon dioxide with a lower index of refraction than the doped core layer.

As the index-of-refraction of the core material is increased, the desired thickness of the layer decreases because of changes in the wavelength with index-of-refraction. Thus, the correlation between these parameters should be controlled accordingly. The use of excessive amounts of certain dopants should be avoided since excessive amounts of certain dopants can result in the loss of transparency of the material with respect to the light. The upper limit on the amount of these dopants depends on the specific dopant, although for most materials there would generally be less than about 40% by weight of these dopants.

Core layers with the same or different optical properties and compositions can be deposited over selected portions of the substrate in the same or different layers to form separate optical structures. Alternatively, after consolidation of core layer material, the material can be contoured to produce one or more desired devices in a particular layer. After the formation of the desired structures from the core material, an over-cladding layer generally is applied. The formation of planar waveguides by flame hydrolysis deposition is described further in U.S. Pat. No. 3,934,061 to Keck et al., entitled "Method of Forming Planar Optical Waveguides," incorporated herein by reference. The formation of coupling elements with etching is described further in U.S. Pat. No. 4,735,677 to Kawachi et al., entitled "Method For Fabricating Hybrid Optical Integrated Circuit," incorporated herein by reference.

Multilayered Optical Structures

Using the approaches described herein a plurality of optical materials can be deposited in a stacked configuration to form a multilayered optical structure. The multilayered structure includes a plurality of layers with different optical properties between materials in different layers. In some embodiments, the optical properties of the materials also vary within a layer such that particular optical devices can be localized within a spatial extent covering only a portion of an individual layers surface area. Thus, the multilayered optical structures can be used as a multilayered stack of planar optical devices, fiber preforms and the like.

Figure 18:
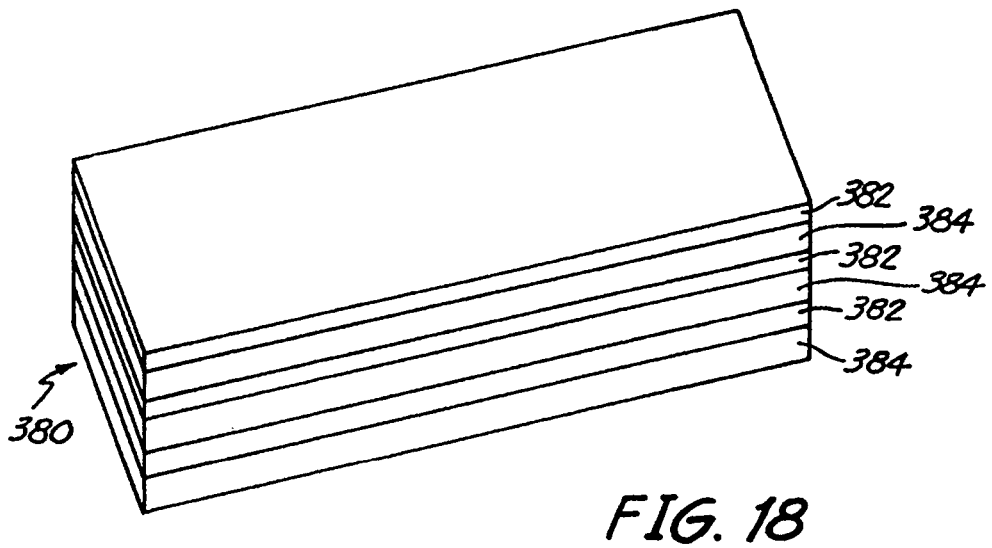
FIG. 18 is a perspective view of a multilayered optical structure.

Referring to FIG. 18, a schematic perspective view of a multilayered optical structure with alternating layers of material A and material B is shown. Specifically, structure 380 includes layers of A 382 alternating with layers of B 384 to form an ABABAB structure. As an example, material A can be $SiO_2$ glass, and material B can be a doped $SiO_2$ glass. An alternative embodiment of a multilayered optical structure is shown in a schematic side view in FIG. 19. In this embodiment, structure 390 has alternating layers of material A 392, layers of material B 394, and layers of material C 396. As an example, material A can be $SiO_2$ glass, material B can be one form of doped $SiO_2$ glass, and material C can be another doped form of $SiO_2$ glass.

Figure 19:
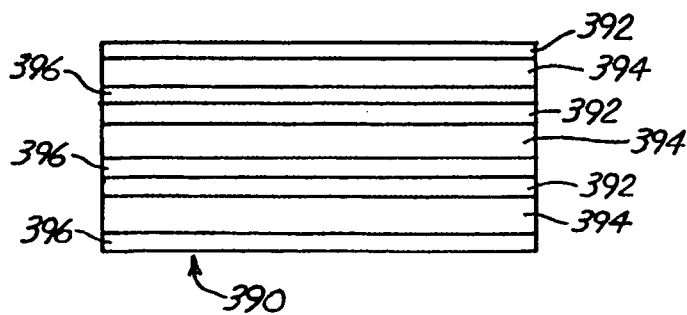
FIG. 19 is a side view of a particular embodiment of a multilayered optical structure.

While FIGS. 18 and 19 show particular numbers of layers, the numbers of layers can be varied as desired. In some embodiments, the layer preforms have three or more layer, in additional embodiments five or more layers, in further embodiments at least 10 layers, in other embodiments at least 20 layers and in still other embodiments at least 30 layers and generally less than about one thousand layers. A person of ordinary skill in the art will recognize that numbers of layers and subranges within these specific ranges are contemplated and are encompassed within the present disclosure. In addition, more than three materials can be used in the layered structure, and the layers can be arranged in more complex patterns and/or in a non-repeating structures.

In general, one or more of the layers of optical material within the optical structure will have non-uniform optical properties across the layer. Generally, the optical properties can be varied by changing the composition across the layer, although optical properties can be varied by altering other properties of the material. For example, the index-of-refraction of some materials can be varied by shining light, e.g., ultraviolet light, on the material. Variations in the optical properties can be used to form optical channels/pathways through the layer such that the light is localized within the optical channels. The optical channels can correspond with planar optical devices or optical pathways of a fiber preform, as described further below.

The total average thickness of individual optical layers is generally no more than about 1 millimeters, in many embodiments no more than about 250 microns, in other embodiments range(s) from about 500 nanometers to about 150 microns, in still other embodiments range(s) from about 3 microns to about 100 microns and in further embodiments range(s) from about 4 microns to about 20 microns. A person of ordinary skill in the art will recognize that ranges and subranges within these explicit ranges are contemplated and are encompassed within the present disclosure. A layer can be identified by one or more boundaries along a particular planar interface. The thickness of a layer can be identified by the thickness perpendicular to the planar surface of the substrate or the plane defining the extent of a substrateless structure as described above.

The multilayered structure can be substrateless. Substrates can be identified as materials that can be optically isolated from materials that transmit light, i.e., non-optical materials. Thus, cladding layers generally are not part of substrates since their optical properties help to confine light within core layers and, therefore, are not optically isolated. Alternatively, multilayered structures can include a plurality of substrates in which further non-optical layers provide buffers between optical layers.

Generally, light reactive deposition involves the deposition of materials onto a substrate. However, it has been discovered that a release layer can be formed such that separation at the release layer separates an optical structure from the substrate on which it was formed. The release layer generally includes powders with significantly higher flow temperatures than the materials deposited above. The composition of the powder can change gradually or abruptly from one composition to another by adjusting the precursor composition in the deposition apparatus. Conditions and compositions can be selected to produce a desirable segregation such that a release layer is formed upon heat treatment. Alternatively, the release layer can be formed by a thermal exposure from the top to consolidate only a portion of the thickness of material, leaving the release layer intact. Formation of release layers and the use of release layers to form substrateless optical structures is described further in copending and commonly assigned U.S. patent application Ser. No. 09/931,977, now U.S. Pat. No. 6,788,866 to Bryan, entitled "Layer Materials On Substrates," incorporated herein by reference.

Stacked Planar Optical Circuits

The multilayered optical structures are suitable for the formation of stacked planar optical circuits. Selected layers of the multilayered optical structure are formed to provide optical channels/pathways through the layer. In some embodiments, the optical channels through the layer include planar optical devices for optical processing/manipulations. In alternative or additional embodiments, one or more integrated optical circuits is located on a single layer with one or more optical channels.

Figure 20:
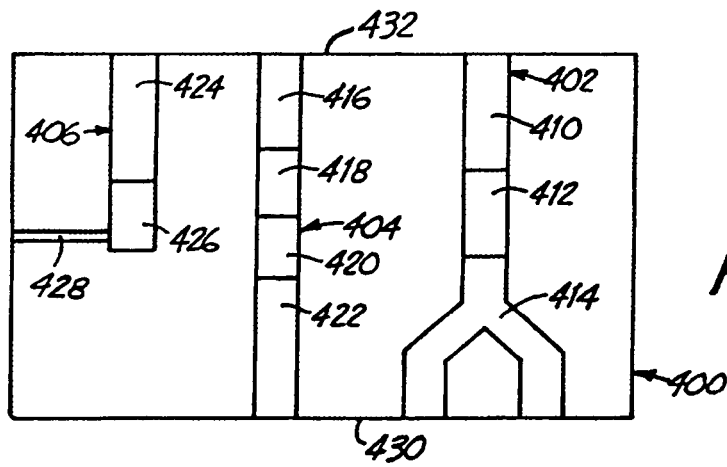
FIG. 20 is a sectional view of a multilayered optical structure taken through a layer having a plurality of optical pathways.

A representative cross section through a layer with planar optical devices is shown in FIG. 20. Layer 400 includes integrated optical circuits 402, 404, 406. Optical circuit 402 includes optical devices 410, 412, 414 while optical circuit 404 includes optical devices 416, 418, 420, 422. Optical circuit 402 includes an optical device 424, such as a planar waveguide, and an electro-optical device 426, such as a photodetector, e.g., a photodiode, with an electrical contact 428. Electrical contact can be formed by light reactive deposition with silver particles or semiconductor processing approaches, such as chemical vapor deposition. While layer 400 is shown with three optical circuits, layers generally can include one or two optical circuits or more than three optical circuits. Similarly, the number of optical devices within an optical circuit can vary as desired within the spatial limits of the layer. Generally, one or more edges of the layer, such as edges 430 and 432 in FIG. 20, are suitable for connection to an optical interconnect, such as a connection to an optical fiber or to other optical devices and/or electro-optical devices.

Regardless of whether or not a substrate is present, the planar optical structures have a planar aspect that is distinctly different from elongated optical fibers and the like. The planar aspect of the planar optical structures can be evaluated based on a planar projection of the structure having the largest projected surface area. This planar projection can be evaluated without complications due to surface features or the like. Generally, the planar structure has a maximum area planar projection with a surface area of at least about 1 cm², in other embodiments at least about 10 cm², in further embodiments at least about 25 cm², in additional embodiments at least about 50 cm², and in some embodiments in range(s) within about 1 cm² to about 1 m². A person of ordinary skill in the art will recognize that ranges and subranges within these explicit ranges are contemplated and are within the present disclosure. A five inch diameter wafer substrate would result in a structure having a maximum projected area of 6.25 π inches².

In addition, the planar optical structures generally have layers with an aspect ratio no more than about 20, in other embodiments no more than about 10 and in other embodiments, no more than about 5. A person of ordinary skill in the art will recognize that other ranges and subranges within these explicit ranges are contemplated and are encompassed within the present disclosure. The aspect ratio is the ratio of the length to width, where the length is the distance along the longest segment in the planar projection connecting two edge points and the width is the distance along the longest segment perpendicular to the length segment connecting two edge points. The aspect ratio can be about 1, which is the lowest valve. The planar nature of the layer can also be expressed in terms of the minimum edge-to-edge distance in the maximum area projection for segments passing through the center of the projected area. Generally, the minimum edge-to-edge distance is at least about 1 cm, in many embodiments at least about 2 cm, in other embodiments at least about 5 cm and in some embodiments within range(s) from about 1 cm to about 1 meter. A person of ordinary skill in the art will recognize that ranges and subranges within these explicit ranges are contemplated and are encompassed within the present disclosure. Rectangular structures are convenient with respect to placement of optical structures along the planar surface. Circular structures are convenient because of the availability of circular shaped substrates.

Multicore Preform—Optical Fiber

The multilayered structures can also be used to form multicore preforms and multicore optical fibers/pathways. These embodiments generally have optical channels/pathways extending along a linear dimension of the material. The multicore optical fibers can be formed from the multicore preforms.

In particular, optical fibers can be formed having a plurality of domains with each domain having a confined channel or core for separate transmission. The optical fibers can be formed from preforms having corresponding structure within the preform. The preforms are essentially multilayered monolithic structures with a structure in the dimension along the direction that the fiber will be pulled such that the composition of the fiber is approximately uniform along its length. By constructing preforms with structures corresponding to multiple cores, optical fibers can be formed to interact with optical devices having a plurality of channels by mimicking the structure of the device to simplify connection between optical fibers and complex optical devices, such as those with multiple integrated layers of optical channels. The fibers provide for more complex connections with complex optical devices to provide for better use of the complex structures.

Figure 21:
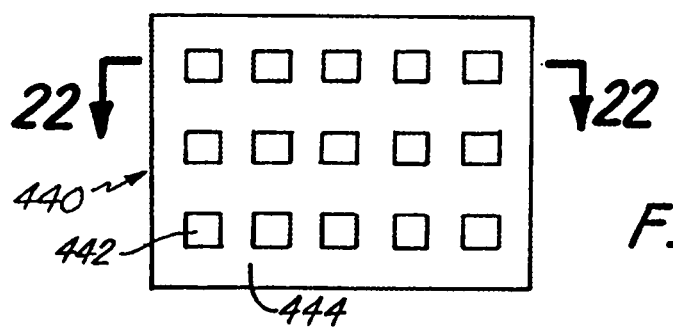
FIG. 21 is a side view of multicore/patterned preform.
Figure 22:
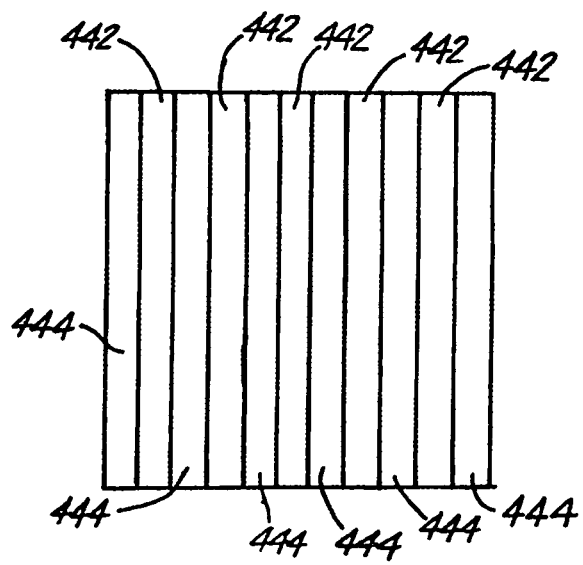
FIG. 22 is a sectional view of the multicore/patterned preform of FIG. 21 taken along lines 22-22 of FIG. 21.

To form a multicore preform, a layering and patterning process can be repeated to form a patterned preform, as shown in FIGS. 21 and 22. Patterned preform 440 includes a plurality of light channels 442 embedded in a background cladding material 444. A specific light channel 442 can be formed from the same or different materials relative to the other light channels 442. Similarly, cladding material 444 can be formed from one or more materials. However, cladding material is different from, at least, adjacent light channel material. In some embodiments, all materials are formed from $SiO_2$ glass with appropriate dopings to form confined light channels and cladding materials. The number and positioning of the optical channels can be varied to form the desired structure. Generally, the multicore fiber has at least 3 optical channels/cores, in additional embodiments at least 5 optical cores, in other embodiments within ranges from about 10 optical cores to about 1000 optical cores and in further embodiments within range(s) from about 20 optical cores to about 100 optical cores. A person of ordinary skill in the art will recognize that ranges and subranges within these explicit ranges are contemplated and are encompassed within the present disclosure.

A preferred way of making the optical fiber with multiple transmission channels involves the formation of a patterned preform such as preform 440 in FIGS. 21 and 22. In contrast with the stacked planar devices described above, preforms are designed based on the desired structure of the resulting fibers. The patterned/layered preform can be pulled using, for example, conventional fiber pulling processes. The preform is heated to soften the material that is then pulled to form the fiber from the preform. The dimensions of the preform structures can be selected to yield a patterned optical fiber with independent light channels with desired dimensions based on the known dimensions of an optical fiber obtained by pulling a preform. Suitable rates generally within range(s) from about 1 meter per minute to about 100 meters per minute. Suitable tension generally within range(s) from about 10 grams to about 40 grams. A person of ordinary skill in the art will recognize that ranges and subranges within these explicit ranges are contemplated and are within the present disclosure. The pulling results in the reduction of the dimensions of the structure. The temperature, tension and pulling rate contribute to the dimensions of the resulting fiber. At reasonable pulling conditions, the fundamental structural relationships of the multicore structure maintained within the reduced dimensions of the fiber. The pulling of fiber optic cables from a preform is described further in U.S. Pat. No. 4,630,890 to Ashkin et al., entitled "Exposed Core Optical Fibers, and Methods of Making Same," incorporated herein by reference. The fiber can be pulled to standard dimensions for an optical fiber or other convenient dimensions based on the multicore structure.

Following pulling, the resulting fiber maintains structure from the preform. In particular, the fiber has isolated light channels through isolated cores that can be individually used to transmit light without interference from neighboring cores. Following pulling, the fiber has a gross structure reminiscent of a standard optical fiber; specifically, the patterned optical fiber generally is flexible.

The patterned fiber can be attached conveniently to an optical device as an alternative to the attachment of a plurality of optical fibers. Since the structure in the optical fiber pulled from a patterned preform can be very small, the patterned optical fiber can attached to structures that cannot conveniently be attached to corresponding optical fibers. Thus, smaller optical devices can be formed and individually accessed with the patterned optical fiber. As a specific example, the patterned optical fiber can be attached to a multilayered structure with stacked planar optical circuits to access individual light channels/pathways through a core of the fiber. A single patterned optical fiber can replace the plurality of optical fibers shown in FIG. 3b of U.S. Pat. No. 6,045,888 to Chen et al., entitled Optical Volume Memory," incorporated herein by reference. Alternatively, the patterned optical fiber can be used as an alternative to or in addition to an optic coupler such as the optic coupler described in U.S. Pat. No. 4,948,217 to Keck et al., entitled "Optic Coupler," incorporated herein by reference.

Non-Volatile Optical Memory

High storage-volume non-volatile optical memory devices make it possible to fundamentally change the configuration of a computer, especially a personal computer. In particular, an optical memory element can include a plurality of executable programs. Preferred optical memory elements are fixed solid-state devices that are integrated into an opto-electronic network within the computer. Selective access to the programs can provide execution of desired routines and selected operating systems. Multidimensional optical memory devices can be constructed from the multilayered optical structures described herein.

A suitable 3-dimensional optical data storage structure is described, for example, in U.S. Pat. No. 6,045,888 to Chen et al., entitled "Optical Volume Memory," incorporated herein by reference (the '888 patent). The non-volatile optical memory described in the '888 patent has a large number of individually addressable cells, i.e., data elements. These data elements can be used for the storage of the programs of interest. This non-volatile optical memory can be accessed with no moving parts since individual data elements are accessed through direction of the light to read a data element. The data element can be addressed using overlapping light beams or using spatial light modulators in which each data element is associated with a controlled modulation pixel. In alternative embodiments, the storage medium, such as a disc or the like, or a focusing element moves to focus light on a single optical data element.

In preferred embodiments, the non-volatile optical memory is used to store a plurality of computer programs. Suitable programs include, for example, operating systems, word processors, spread sheets, drawing programs, communication programs, games and the like. These programs can be selectively accessible.

In particularly preferred embodiments, the non-volatile optical memory is attached to a mother-board by a connector. The non-volatile memory can be removable from the connector to provide for replacement with a different memory device. For example, a global upgrade can be performed of the programs stored on the optical memory device. Replacement of the optical memory device can also involve elimination and/or addition of program choices.

The programs stored on the optical memory can be locked with an activation number. The access can be limited based on the presence of an appropriate license and/or activation number. Similar limitation on access is presently built into a variety of software programs. For example, some software presently available on the Internet can be downloaded but not run without an access code.

Using an access code provides for the storage of a large quantity of software on a single optical memory device with access limited to a portion of the software. In particularly preferred embodiments, the optical memory device can include all or a significant fraction of the software available for the hardware. The user then accesses the software licensed to that user by entering the appropriate access codes. Additional software can be accessed later by acquiring the appropriate access code. Upgrades are performed globally by replacing the nonvolatile optical memory device. Additional software can be accessed using traditional volatile storage or other non-volatile memory, in addition to the non-volatile optical memory. In preferred embodiments, an individual personal computer would have no hard disc drive storage or other volatile storage except for RAM memory. In particular, all executable code preferably would be found in the optical memory device. Work product can be stored preferably on a central server or other network server, such as an Internet server, although work product can be stored on other volatile memory or non-volatile memory associated with the computer, such as a small disc drive or solid-state memory.

Use of non-volatile optical memory for program storage can result in a fundamental reversal of the role of non-volatile memory from a relatively insignificant role relative to volatile storage, such as hard disc drives, to a central role with volatile storage playing a minor role. The use of more non-volatile solid-state integrated memory provides for almost instant-on start up of the computer because of rapid access to the non-volatile optical memory. The substitution of high-speed non-volatile memory for a majority of the memory capacity can provide for faster access to large quantities of information.

As utilized herein, the term "in the range(s)" or "between" comprises the range defined by the values listed after the term "in the range(s)" or "between", as well as any and all subranges contained within such range, where each such subrange is defined as having as a first endpoint any value in such range, and as a second endpoint any value in such range that is greater than the first endpoint and that is in such range.

The embodiments above are intended to be illustrative and not limiting. Additional embodiments are within the claims below. Although the present invention has been described with reference to specific embodiments, workers skilled in the art will recognize that changes may be made in form and detail without departing from the spirit and scope of the invention.

What is claimed is:

1. A method for forming a structure with at least three particle coatings covering at least a portion of a planar substrate surface that has a length and a width, the method comprising:

flowing a reactant stream from a reactant nozzle into a chamber enclosed from the ambient atmosphere and vented through a pumped conduit spaced away from a planar substrate to make a flowing sheet of reactants while simultaneously flowing inert shielding gas from an opening adjacent the reactant nozzle to create flowing sheets of shielding gas that flow in the same direction as the sheet of reactants and confines spreading of the reactants, reacting the reactant stream along a path to form a stream of particles having a propagation direction; and depositing at least a portion of the particle stream onto the planar substrate in the chamber by longitudinally moving the substrate through the particle stream three times, wherein at least one of the particle coatings has a different composition from the other two particle coatings and wherein at least one layer is patterned during the deposition process to cover a selected portion of the planar substrate, wherein the composition of the particle stream changes between the longitudinal movements of the substrate through the particle stream, wherein the reaction is driven by a light beam along a path that intersects with the path of the flowing sheet of reactants without striking the substrate and wherein the flowing sheet of reactants has a cross section perpendicular to the propagation direction and is positioned to cover only a portion of the substrate, and is characterized by a major axis and a minor axis, the major axis being at least as large as the substrate width and being at least a factor of two greater than the minor axis so that each longitudinal movement of the substrate forms an entire coating on the substrate, and wherein the shielding gas confines reactants and the particles within the reactant stream and particle stream, respectively, through the chamber.

2. The method of claim 1 wherein the deposition rate is at least about 10 g/hr.

3. The method of claim 1 wherein the reactant stream is elongated in a direction along the propagation direction of the radiation beam to produce a line of particles with the relative motion of the substrate sweeping at least a portion of the line of product particles across the substrate.

4. The method of claim 1 wherein the deposition of the particles comprises moving the substrate relative to the stream of product particles at a rate of at least about 0.1 centimeters per second.

5. The method of claim 1 wherein the deposition of the particles comprises moving the substrate relative to the stream of product particles at a rate from about 1 centimeters per second to about 30 centimeters per second.

6. The method of claim 1 wherein the depositing of the three particle coatings is performed in no more than about 15 seconds.

7. The method of claim 1 wherein the depositing of the three particle coatings is performed in no more than about 9 seconds.

8. The method of claim 1 wherein the at least three particle coatings comprises at least five particle coatings and the method further comprises depositing at least a portion of a particle stream onto a substrate by moving the substrate through the particle stream five times within a period of no more than about one minute.

9. The method of claim 1 further comprising consolidating the three particle coatings into three layers of optical material having different optical properties.

10. The method of claim 9 wherein the consolidating of the three particle coatings is performed following the deposition of the three layers.

11. The method of claim 9 wherein the consolidating of the three particle coatings is performed in at least two heating steps with at least one of the heating steps being performed prior to completing the deposition of the three particles coatings.

12. The method of claim 1 wherein the substrate has an aspect ratio between about 1 and about 20.

13. The method of claim 1 wherein the length and width are equal and wherein the substrate is circular.

14. The method of claim 1 wherein the patterning during deposition is performed by varying the reactant composition as the substrate is moved through the particle stream.

15. The method of claim 1 wherein the patterning during deposition is performed with a mask.

16. A method for forming a multi-layer, multi-path optical material in a monolithic planar optical structure that is planar in an x-y plane with a height in a z-axis perpendicular to the x-y plane, the method comprising performing, within a chamber enclosed from the ambient atmosphere and vented through a pumped conduit spaced away from a planar structure, multiple passes of the planar structure through a flowing stream of product particles to form at least three planar layers stacked in the z-axis comprising a cladding layer between a first active layer and a second active layer, each of the planar layers comprising silica glass following consolidation, wherein the composition of the product particles changes between passes wherein the first active layer and the second active layer each comprises a plurality of cores each of which forms an optical pathway and compositions forming the first active layer and second active layer are patterned to form the optical pathways, wherein the plurality of cores each has an index of refraction greater than the cladding layer and wherein the flowing stream of product particles is formed within the chamber by a reaction driven by a focused radiation beam along a path that intersects with a flowing reactant stream without striking the structure, with the reactant stream entering the chamber from a reactant nozzle, wherein sheets of inert shielding gas are simultaneously flowed from an opening adjacent the reaction nozzle to confine reactants and the product particles within the reactant stream and the particle stream, respectively, through the chamber.

17. The method of claim 16 wherein the stream of particles has a cross section characterized by a major axis and a minor axis with the major axis being at least a factor of five larger than the minor axis.

18. The method of claim 17 wherein the major axis is sufficiently large that the product stream simultaneously coats the structure along an entire linear dimension extending across the structure resulting in the deposition of an entire coating of the structure with one linear pass through the product stream.

19. The method of claim 16 wherein the flowing reactant stream comprises an aerosol.

20. The method of claim 16 wherein the focused radiation beam is a light beam.

21. The method of claim 16 wherein the particles comprise silica.

22. The method of claim 16 wherein the composition of the product particles between passes differ in dopant composition within a silica host.

23. The method of claim 16 wherein the patterning is performed during deposition.

24. The method of claim 16 wherein the patterning is performed following deposition.

* * * * *